(12) United States Patent  (10) Patent No.: US 8,932,489 B2
Yu et al.  (45) Date of Patent: Jan. 13, 2015

(54) COLLOIDAL NANOCRYSTAL ENSEMBLES WITH NARROW LINEWIDTH BAND GAP PHOTOLUMINESCENCE AND METHODS OF SYNTHESIZING COLLOIDAL SEMICONDUCTOR NANOCRYSTALS

(75) Inventors: Kui Yu, Kanata (CA); Jianying Ouyang, Ottawa (CA)

(73) Assignee: National Research Council of Canada., Ottawa, ON (CA)

( * ) Notice: Subject to any disclaimer, the term of this patent is extended or adjusted under 35 U.S.C. 154(b) by 751 days.

(21) Appl. No.: 13/058,239

(22) PCT Filed: Aug. 11, 2009

(86) PCT No.: PCT/CA2009/001127
§ 371 (c)(1),
(2), (4) Date: Feb. 9, 2011

(87) PCT Pub. No.: WO2010/017634
PCT Pub. Date: Feb. 18, 2010

(65) Prior Publication Data
US 2011/0140046 A1      Jun. 16, 2011

Related U.S. Application Data

(60) Provisional application No. 61/136,108, filed on Aug. 12, 2008.

(51) Int. Cl.
*C09K 11/02*      (2006.01)
*C09K 11/08*      (2006.01)
(Continued)

(52) U.S. Cl.
CPC ................. *C30B 29/48* (2013.01); *C30B 29/46* (2013.01); *C30B 7/14* (2013.01); *B82Y 30/00* (2013.01)
USPC ....... 252/301.6 S; 252/301.4 R; 252/301.6 R; 252/301.6 P; 252/301.4 S

(58) Field of Classification Search
CPC ..... C09K 11/565; C09K 11/70; C09K 11/881
USPC ........ 252/301.4 R, 301.6 S, 301.4 P, 301.6 R, 252/301.4 S, 301.6 P
See application file for complete search history.

(56) References Cited

U.S. PATENT DOCUMENTS 7,181,266 B2   2/2007   Frangioni et al.
8,337,721 B2 * 12/2012   Bowers et al. .......... 252/301.6 S
(Continued)

FOREIGN PATENT DOCUMENTS

CA   2424415 A1   4/2002
CN   1673095 A    9/2005
(Continued)

OTHER PUBLICATIONS

Dabbousi. (CdSe)ZnS Core-Shell Quantum Dots: Synthesis and Characterization of a Size Series of Highly Luminescent Nanocrystallites. J. Phys. Chem. B 1997, 101, 9463-9475.*

(Continued)

*Primary Examiner* — Matthew E Hoban
(74) *Attorney, Agent, or Firm* — Jason E. J. Davis

(57) ABSTRACT

A method of synthesizing colloidal semiconductor nanocrystals involves contacting a source of at least one semi-conductor cation element (Group 11-14, more preferably Group 12-14, more preferably 12 or 14, more preferably Cd, Zn, Hg or Pb, most preferably Cd) with a source of at least one Group 15, or 16 element in the presence of a ligand forming compound containing a carboxylic acid moiety in a reaction medium comprising a solvent that is substantially noncoordinating with respect to the at least one cation, the ligand forming compound and the source of at least one cation element having a molar ratio of 1:1 or less. The cation element source is preferably bonded to two low carbon acids. Some of the low carbon acids are substituted with the ligand forming compound to produce a cation precursor that is more soluble in the noncoordinating solvent. The method produces novel ensembles of colloidal semiconductor nanocrystals that have narrow linewidth absorption and bandgap photoluminescence spectra indicating that the colloidal semiconductor nanocrystals are of substantially a single size. The single size families are produced for CdSe, CdTe, CdS, CdSeTe, and CdP.

24 Claims, 21 Drawing Sheets

(51) Int. Cl.

| | |
|---|---|
| *C09K 11/70* | (2006.01) |
| *C09K 11/77* | (2006.01) |
| *C09K 11/56* | (2006.01) |
| *C09K 11/54* | (2006.01) |
| *C30B 29/46* | (2006.01) |
| *C30B 29/48* | (2006.01) |
| *C30B 7/14* | (2006.01) |
| *B82Y 30/00* | (2011.01) |

(56) References Cited

U.S. PATENT DOCUMENTS

2005/0118631 A1    6/2005    Bawendi et al.
2007/0111324 A1*   5/2007    Nie et al. .................... 436/518
2007/0166731 A1    7/2007    Miller et al.

FOREIGN PATENT DOCUMENTS

| WO | 03/012006 A1 | 2/2003 |
|---|---|---|
| WO | 2006/023206 A2 | 3/2006 |
| WO | WO2008/063652 * | 5/2008 |
| WO | 2009/020430 A2 | 2/2009 |

OTHER PUBLICATIONS

Yu. Experimental Determination of the Extinction Coefficient of CdTe, CdSe, and CdS Nanocrystals. Chem. Mater. 2003, 15, 2854-2860.*
Zhong. A facile route to violet- to orange-emitting CdxZn1-x Se alloy nanocrystals via cation exchange reaction. Nanotechnology 18 (2007) 385606 (6pp).*
Pinar Dagtepe. Quantized Growth of CdTe Quantum Dots; Observation of Magic-Sized CdTe Quantum Dots. J. Phys. Chem. C 2007, 111, 14977-14983.*
Kudera. Supporting information for Sequential growth of magic size CdSe nanocrystals. Retrieved from http://www.wiley-vch.de/contents/jc_2089/2007/c1015_s.pdf. Published Jan. 2007. Retrieved on May 29, 2014.*
von Holt. Ligand exchange of CdSe nanocrystals probed by optical spectroscopy in the visible and mid-IR.J. Mater. Chem., 2008, 18, 2728-2732.*
Wei. Isostructural Cd3E2 (E=P, As) Microcrystals Prepared via a Hydrothermal Route. Crystal Growth & Design 2006 vol. 6,No. 4 849-853.*
Green. A Novel Synthesis of Cadmium Phosphide Nanoparticles Using the Single-Source Precursor [MeCdPtBu2]3. Adv. Mater. 1998, 10, No. 7.*
Green. The synthesis of cadmium phosphide nanoparticles using cadmium diorganophosphide precursors. J. Mater. Chem., 1999, 9, 243-247.*
Yordanov. The effects of temperature and carboxylic acid ligand on the growth of nanocrystalline CdSe in a hot paraffin matrix. Colloids and Surfaces A: Physicochem Eng Aspects 273 2006.*
ISR-WO-in-PCT-CA2009-001127 dated Nov. 10, 2009.
Bawendi, Moungi G; et al. Adv. Mater. 1999, 11, 1243.
Bowers, MJ; et al. J. Am. Chem. Soc. 2005, 127, 15378-15379.
Cao, YC. Angewandte Chimie Int. Ed. 2005, 44, 6712-6715.
Dagtepe, P; Chikan, V; et al. Chem. C, 2007, 111, 14977-14983.
Dai, Q; et al. Nanotechnology 2007, 18, 405603.
Fernando, M.; Yum, GW; et al Computer-Aided Mater Des. 2007,14, 167.
Kasuya, A; et al. Nat. Mater. 2004, 3, 99-102.
Kudera, S; et al. Adv. Mater. 2007, 19, 548-552.
Landes, C; et al. Nano Letters 2001, 667-670.
Peng, ZA. J. Am. Chem. Soc. 2001. 123: 183-184.
Ptatschek, V; et al. Ber. Bunsenges. Phys. Chem. 1998, 102, 85-95.
Schlegel, G; et al. Phys. Rev. Lett. 2002, 88(13), 137401.
Soloviev, VN; et al. J. Am. Chem. Soc. 2001, 123, 2354-2364.
Wu. S. et al. Nanotechnology 2007, 18: 485607.
Wuister, SF; et al Phys. Chem. Chem. Phys., 2003, 5, 1253-1258.
Yang, Y; et al. Angew. Chem. Int. Ed. 2005, 6712-6715.
Yu, Kui; et al. Articles, J. Phys. Chem. 2009, 3390-3401.
Yu, WW; et al. Angewandte Chimie Int. Ed. 2002, 41, 13, 2368-2371.
Yu, WW; et al. Chem. Mater. 2003, 15, 2854-2860.
Dai, Q. et al. J. Phys. Chem. B. 2006, 110: 16508-16513.
Yordanov, G. et al. Colloids and Surfaces A.: Physiochem. Eng. Aspects.
Ouyang, J. et al. J. Phys. Chem. C. 2008, 112: 4908-4919.
Soloviev, V.N. J. Am. Chem. Soc. 2000, 122: 2673-2674.

* cited by examiner

COLLOIDAL NANOCRYSTAL ENSEMBLES WITH NARROW LINEWIDTH BAND GAP PHOTOLUMINESCENCE AND METHODS OF SYNTHESIZING COLLOIDAL SEMICONDUCTOR NANOCRYSTALS

CROSS-REFERENCE TO RELATED APPLICATIONS

This application is a national stage entry of International Patent Application PCT/CA2009/001127 filed Aug. 11, 2009 and claims the benefit of U.S. Provisional Patent Application Ser. No. 61/136,108 filed Aug. 12, 2008.

FIELD OF THE INVENTION

The invention relates in general to colloidal semiconductor nanocrystals, their ensembles, and methods of production. In particular the invention relates to novel classes of narrow linewidth, bandgap photoluminescent, colloidal semiconductor nanocrystals and their production.

BACKGROUND OF THE INVENTION

Photoluminescent Quantum Dots (QDs) are an important research field at the frontier of science. There is keen interest in both the fundamental understanding of their photophysical properties and in their promising bio-oriented and energy-oriented applications.

Semiconductor QDs are single nanocrystals, typically spherical in shape, with diameters of a few nanometers (nm). For bulk semi-conductor materials, the absorption of a photon with energy above the semi-conductor bandgap energy results in the creation of an electron-hole pair called an exciton. When nanocrystals are smaller or comparable to their Bohr excitons (a few nanometers (nm)), their bandgap energy increases with energy levels quantized: the bandgap energy value is directly related to their sizes. Such a size-related effect is called quantum confinement; hence, the spherical nanocrystals are termed as "quantum dots". In addition to the bandgap, quantum confinement effects lead to physical properties, including electronic and magnetic properties of QDs that are substantially different from those of bulk materials. It is known to produce semiconductor QDs by various methods. Generally QDs need to be isolated from each other so that they do not agglomerate and accrete, as accreted agglomerates of QDs become bulk crystalline material that does not exhibit the useful properties of QDs. It is known to isolate QDs from each other: 1—by forming QDs on substrates, 2—by coating individual QDs with inert layers, or 3—by capping the QDs with surface ligands to produce what are known as colloidal semiconductor QDs.

The sizes of colloidal semiconductor nanocrystals can be controlled by parameters of the process by which they are produced. It is known to produce colloidal nanocrystals by wet chemistry, so that the semiconductor nanocrystals are bound to one or more ligands which serve to isolate the nanocrystals. Methods of producing colloidal semiconductor nanocrystals by known wet-chemistry synthetic methods yield a various ensembles of semiconductor nanocrystals of various purities, separated by one or more known ligands. For example, approaches with hot injection, and reverse micelle reactions are known.

As noted by Y Charles Cao in Angewandte Chimie Int. Ed. 2005, 44, 6712-6715, and in WO06023206, the most successful and widely used nanocrystal synthesis method relies on rapid precursor injection, but unfortunately these are not readily industrially scaled. The process for controlling crystal growth requires very short periods and excellent thermal controls to produce quality nanocrystals. Cao proposes a technique that is based on a purified cadmium myristate precursor, and only uses an acid for stabilizing the growth of nanocrystals after a point.

There have been a great number of methods of synthesizing colloidal semiconductor nanocrystals. One example is taught by Yu and Peng in Angewandte Chimie Int. Ed. 2002, 41, 13, 2368-2371. In this example, as in many others that involve ligand forming acids having carboxylic groups, Cd precursors are produced that are solubilized by virtue of the ligand forming acids. Specifically CdO is mixed with oleic acid, whereby the oxygen is stripped from the Cd and replaced by a pair of oleic acid molecules to produce the precursor, in an ODE reaction medium. If the CdO is not dissociated, it will not be suspended in the ODE. Accordingly this method requires a higher acid to CdO molar ratio. It goes without saying that CdO precipitate will interfere with nanocrystal synthesis. This method is just one example of hot injection reactions that requires heating of the ODE and Cd precursor to 300° C. followed by injection and rapid crystal growth (on the order of tens of seconds) at a lower temperature (250° C.). In short their method would not work if a lower acid to Cd molar ratio were provided.

Furthermore the 2:1 or greater acid:Cd molar ratio required in such reactions (molar ratios of 3:1-210:1 were used) have the effect of making the precursor highly soluble, as both binding sites of the Cd are occupied by long chain (oleic) acids. Moreover, excess acid in the ODE improves the solvent's ability to suspend the precursors. All of this makes for fast precipitation reaction using very different precipitation dynamics from those used in the present invention. This is characteristic of such high temperature injection methods.

There are several properties of semiconductor nanocrystals that make them of interest, including photoluminescence. Adv. Mater. 1999, 11, 1243 "Photoluminescence from Single Semiconductor Nanostructures" by Moungi G. Bawendi, et al. notes "Size-dependent optical properties with band edge absorption and emission wavelengths that are tunable across the visible range (~400±700 nm) make CdSe nanocrystals of particular interest for the study of fundamental physics as well as potential optoelectronic device application . . . . Variations in size and shape within ensemble samples can result in extensive inhomogeneous spectral broadening . . . . The result is a loss of spectral information in ensemble samples." In this paper, single semiconductor nanocrystals were experimented with, and the inhomogeneous spectral broadening was found to be 80 meV at a low temperature (10 K). The problem of inhomogeneous spectral broadening is well known in the art.

One reason for desiring a narrow linewidth is to provide specific, selective response of a probe, which may be useful in biomedical probe applications, bar code applications, and other molecular labeling analyses. Another reason is for laser applications where narrow emission spectra provide high energy density at specific wavelengths and therefore provide more efficient conversion of pump power into a single mode emission. It may further be desired to use such narrow linewidth emitters for standards and references. They might also be used in display devices.

For example, International patent application WO 03/012006 to Peng et al., entitled Colloidal Nanocrystals With High Photoluminescence Quantum Yields asserts the need for colloidal nanocrystal production methods that allow for the manipulation of the purity of the emission color, by controlling the full width at half maximum (FWHM) of the nanocrystal PL peak. Peng et al state that it is desirable to develop methods that provide emission peaks sufficiently sharp so as to approach those observed by single dot spectroscopy (in the 20 nm range). Peng et al. also indicates that the bandwidth of known CdSe colloidal solutions have a peak linewidths around 27-40 nm wide (FWHM), and that single dot spectroscopy indicates that the individual peak linewidths are less than 20 nm. The narrowest CdSe nanocrystal ensembles produced by Peng et al. have peaks 23-24 nm FWHM.

Naturally it would be highly desirable to provide an ensemble of nanocrystals that have nominally a same size, so that the ensemble exhibits single size optical properties. While this might seem impossible given the thermodynamics of the chemical processes used to produce colloidal semiconductor nanocrystals, there have been some reports of "magic sized" colloidal semiconductor nanocrystals. The theory behind magic sized nanocrystals is that some structural features of the nanocrystals admits of preferential formation of certain sizes in analogy to gold and carbon which have known magic sizes. The challenge is to provide an environment that permits such preferential formation.

Unfortunately "magic size" properties of semiconductor materials are not well understood. The physics of the nanocrystals structurally, and accordingly the properties that they exhibit are still in question. As noted above by Peng et al. some researchers have believed that single sized nanocrystals would have a line width of about 20 nm. Schlegel et al. (G. Schlegel, et al. *Phys. Rev. Lett.* 2002, 88(13), 137401) reported that individual nanocrystals (ZnS-covered CdSe QDs) have line widths of 50 meV, or roughly 10 nm. Magic size nanocrystals are widely presumed to occur only in the smallest of QD sizes, which is natural given that the other existing magic size nanocrystals such as Gold (55), hot Sodiums (8, 20, 40, and 58) and Carbons (60 and 70) have fewer than 100 atoms.

As early as 1998, Ptatschek et al. (Ptatschek, V. et al. *Ber. Bunsenges. Phys. Chem.* 1998, 102, 85-95) reported magic-sized CdSe clusters, obtained at room temperature by cluster chemistry. These clusters exhibited sharp HOMO-LUMO absorption peaks at 280, 360, and 410 nm, corresponding to gyration sizes of 0.42, 0.85, and 1.7 nm suggested by small-angle X-ray scattering (SAXS), respectively. A composition of these clusters was found to be $Cd_{34}Se_{19}L_{37.5}$ (L=ligands). Structurally a Koch pyramid structure with the lateral length of 1.7 nm was proposed for the cluster exhibiting its absorption peak at 410 nm. No photoemission is associated with the HOMO-LUMO peaks, and so these clusters are not bandgap photoluminescent. The linewidths of the HOMO-LUMO absorption peaks are greater than 20 nm.

In 2001 (Soloviev, V. N. et al. *J. Am. Chem. Soc.* 2001, 123, 2354-2364), a series of CdSe cluster molecules, synthesized at room temperature by cluster chemistry, was described to cover a size range of 0.7-2 nm. Single-crystal X-ray diffraction and elemental analysis showed that the clusters have 4, 8, 10, 17, or 32 Cd atoms capped with selenophenol capping ligands, with a combination of adamanthane and barylene-like cages, which are the building blocks of the zinc-blende and wurtzite bulk CdSe. Photoluminescent excitation (PLE) performed at 8K showed an exciton absorption peak of the 32-Cd cluster at 374 nm. No bandgap photoluminescence is observed.

With a reverse-micelle approach, in 2004 (Kasuya, A. et al. *Nat. Mater.* 2004, 3, 99-102), Kasuya et al. reported a $(CdSe)_n$ nanocrystal ensemble exhibiting a sharp absorption peak at 415 nm (at the lowest energy). These nanocrystals were characterized as having n=33 or 34 by time-of-flight mass spectra and a diameter of 1.5 nm by atomic force microscopy. With first-principles calculations, they were imaged with a core-cage structure, a three-dimensional network consisting of a core of $(CdSe)5\sim 6$ and cages of $(CdSe)28$. The width of the band edge absorption band of the $(CdSe)34$ single-sized ensemble reported by Kasuya et al. (Kasuya, A. et al., *Nature Materials* 2004, 3, 99) was estimated from their FIG. 2 to be ~150 meV, which is greater than 20 nm.

16 a hot-injection approach in 2005 (Bowers, M. J. et al. *J. Am. Chem. Soc.* 2005, 127, 15378-15379), Bowers et al. reported producing a CdSe magic-sized nanocrystal ensemble exhibiting a narrow (FWHM>20 nm) exciton absorption spectrum peaking at 414 nm. This ensemble was synthesized 16 the injection of a Se-precursor solution into a Cd-precursor solution at 330° C., followed by a short growth period of 2-10 s at lower temperature. The nanocrystals ensemble showed no bandgap photoemission.

At the end of 2007, a CdSe MSN ensemble exhibiting a narrow (FWHM>20 nm) exciton absorption spectrum peaking at 414 nm was reported (Dai, Q. et al. *Nanotechnology* 2007, 18, 405603). The ensemble was obtained 16 a hot-injection approach involving the injection of a Se-precursor solution into a Cd precursor solution at 220° C., followed by a growth at 190° C. The nanocrystals ensemble showed no bandgap photoemission. While it is difficult to assess the FWHM for the curves given, the linewidth of the absorption spectrum peak at 414 nm is greater than 15 nm.

In all of the above descriptions of MSNs produced by various methods (reverse micelle, hot injection, and cluster chemistry), nanocrystals are produced, but in no case did the nanocyrstals exhibit band gap photoluminescence, and in no case did the ensembles exhibit an absorption spectrum having a peak as narrow as 10 nm, or at a wavelength above 415 nm.

At the beginning of 2007, Kudera et al. reported several families of CdSe "MSNs" with their first absorption peaks at 330, 350-360, 384, 406, 431, and 447 nm (Kudera, S. et al. *Adv. Mater.* 2007, 19, 548-552). The families were produced by the injection of a Se-precursor solution into a Cd-precursor solution at 80° C., followed by a growth period spanning from 3 min to several hours at 80° C. The ligands were in the form of amines. Kudera et al. reports that these families developed 16 sequential growth: relatively small families progressively evolved into relatively larger ones.

These families exhibit absorption peaks having linewidths (FWHM) in the neighbourhood of 20 nm. If the intrinsic linewidth of a QD were around 20 nm as suggested by some researchers, these might be taken to be MSNs, however it does not appear to be so. It is unlikely that the CdSe QDs produced are exclusively MSNs given the linewidths shown in the paper.

According to Kudera et al., the families produced exhibit considerable photoluminescent emission from trap states, and band-edge emission that was only clearly visible at very high dilutions. No band-edge emission was demonstrated in the results. Furthermore as agglomeration appears to have occurred subsequent to the size-selective precipitation process used to substantially isolate one family from the produced ensemble containing other QDs, it is far from clear to one skilled in the art what was observed. It might have been trap state emission that was observed. In any case, Kudera et al. does not show QDs that demonstrate band gap photoluminescence, and on the evidence of the paper no peak having a linewidth less than 20 nm FWHM is presented.

Moreover the absorption peaks of the families taught by Kudera et al. do not coincide with any of the stable families of bandgap photoluminescent disclosed herein.

Kudera et al. tacitly endorses the belief that MSNs are smaller than QDs. In all of the above descriptions it is clear that the belief in the art is that MSNs are small quantum dot phenomena (clusters—small nanocrystals). That is, while QDs are generally 1-10 nm in diameter, CdSe MSNs are smaller than 2 nm in diameter, and correspondingly have absorption peak wavelengths in lower than 450 nm. Reported CdS MSNs have absorption peak wavelengths of (~305 nm see Yu and Peng above). Reportedly, CdTe MSNs have absorption spectral peaks broader than 20 nm centered around 450 nm and lower (Phys. Chem. Chem. Phys., 2003, 5, 1253-1258, and J Phys. Chem. C, 2007, 111, 14977-14983). None of these are bandgap photoluminescent.

There therefore remains a need for a method of synthesizing nanocrystals that provides an ensemble of colloidal semiconductor nanocrystals. In particular there remains a need for a method of synthesizing colloidal semiconductor nanocrystals that provides long growth/annealing periods. There remains a need for a low cost method of synthesizing high quality colloidal semiconductor nanocrystals that does not require hot injection, and so is readily industrially scaled-up. The need for methods of synthesizing colloidal semiconductor nanocrystals having narrow linewidths and bandgap photoluminescence is high.

There is a need for ensembles of colloidal semiconductor nanocrystals that exhibit narrow absorption peaks, less than or near 10 nm at FWHM, especially those with absorption peaks at or above 450 nm, since larger size colloidal semiconductor nanocrystals families are more stable.

There is also a need for ensembles of colloidal semiconductor nanocrystals of ternary structures, such as CdSeTe, especially when they exhibit high stability.

The most potent wavelength range for controlling melatonin production is 446 nm-477 nm. Therefore, there is a further need for emitters that have the potential application in the therapeutic use of light for treating winter depression and circadian disorders. There is also a need for emitters having high quantum yield.

There remains a need for a colloidal semiconductor nanocrystal that has improved stability and can be preferentially produced, with absorption peaks at or above 450 nm. Colloidal semiconductor nanocrystals are also desired that are bandgap photoluminescent, especially at or above 450 nm. It is noted that peaks in this neighbourhood are blue in colour or redder.

SUMMARY OF THE INVENTION

Applicant has discovered a method of producing colloidal semiconductor nanocrystals by wet chemistry, and has synthesized batches that consist essentially of same-size nanocrystals. The colloidal semiconductor nanocrystals as an ensemble exhibits bandgap photoluminescence with a linewidth in the neighbourhood of 10 nm (linewidths of 20 nm for ternary colloidal semiconductor nanocrystals), which is substantially the width of a bandgap photoluminescent peak of a single nanocrystal.

Several families of bandgap photoluminescent colloidal semiconductor nanocrystals have been produced. Specifically, colloidal CdSe nanocrystal families having absorption spectral peaks near 395 nm, 463 nm, 513 nm, and 551 nm; colloidal CdS nanocrystal families having absorption spectral peaks near 324 nm, 378 nm, 408 nm and 430 nm; and colloidal CdTe nanocrystals families having absorption spectral peaks near 428 nm, 499 nm, 553 nm, and 598 nm are found. The method also produced CdSeTe ternary colloidal semiconductor nanocrystals having bandgap photoemission peaks near 430 nm and 520 nm. CdSe doped with S and/or Zn were also produced that improved thermal stability of the 395 and 463 families, and permitted a controlled blueshifting of the absorption spectral peaks and photoluminescent peaks. The addition of the S was found to greatly improve a quantum yield of the nanocrystals, and to suppress trap state emission. Finally single-sized CdP nanocrystal ensembles were produced that exhibited bandgap absorption peaking at 451 nm with FWHM of only 17 nm, proving that the synthesis method can be applied equally to II/V elements, as well as II/VI elements.

Accordingly a method of synthesizing colloidal semiconductor nanocrystals is provided. The method involves contacting a source of at least one semiconductor cation element with a source of at least one semiconductor anion element in the presence of a ligand forming compound containing a carboxylic acid moiety in a reaction medium comprising a solvent that is at least substantially noncoordinating with respect to the cation, the ligand forming compound and the at least one cation element having a molar ratio of 1:1 or less.

The noncoordinating solvent may be 1-octadecene. The ligand forming compound may be a saturated fatty acid having a chemical formula $CH_3(CH_2)_nCOOH$, wherein n is an integer from 6 to 28. The at least one cation element may be in Group 11, 12, 13 or 14 of the periodic table, and the at least one anion may be in Group 15, 16 or 17 of the periodic table. More prefereably the at least one cation element is in Group 12, 13 or 14 of the periodic table, and the at least one anion is in Group 15, or 16 of the periodic table. More preferably the at least one cation element is in Group 12, 13 or 14 of the periodic table, and the at least one anion is in Group 15, or 16 of the periodic table. More preferably, the at least one cation element is in Group 12 or 14 of the periodic table, and the at least one anion is in Group 15 or 16 of the periodic table. The cation is preferably from Group 12 or Group 14, more preferably Cd, Hg, Zn, and Pb, more preferably Cd. The source of Group 12 element may contain Cd, and may be cadmium acetate dihydrate. The source of at least one anion element and the source of at least one Group 12 element have a molar ratio of 1:1 or greater. The at least one cation is preferably Cd, and the source of anion element may include elemental Se; elemental S; elemental Te; a mixture of elemental Se and elemental Te, and the Se and Te are first solubilized in trioctylphosphine before contacting the source of at least one cation element; bis(trimethylsilyl) sulfide; and thioacetamide.

The contacting may be performed in vacuo. For example, the reaction medium may be heated for a first length of time at a first temperature in vacuo and then heated to a higher second temperature under an inert atmosphere for a second length of time.

The colloidal semiconductor nanocrystals may be bandgap photoluminescent, they may be substantially all of a single size; and may have collectively a bandgap photoemission linewidth of 10±7 nm.

In accordance with the invention, an ensemble created by the above method is provided.

An ensemble of bandgap photoluminescent colloidal semiconductor nanocrystals having at least one absorption and bandgap photoemission linewidth of 10±7 nm is provided. The ensemble may have absorption and emission linewidths of a single nanocrystal, and the center wavelengths of which may be above 450 nm.

Also provided are bandgap photoluminescent colloidal semiconductor nanocrystals having equal numbers of group 12 and group 16 elements and passivated by a surface-capping group. The semiconductor may be CdSe, in which case the absorption spectral peak may be near one of: 395 nm, 465 nm, 513 nm, and 551 nm. The CdSe may be doped, for example with S and/or Zn, resulting in a blueshift of the absorption spectral peak. The semiconductor may be CdS, in which case the absorption spectral peak may be near 311 nm, 324 nm, 353 nm, 365 nm, 378 nm, 408 nm and 430 nm. The semiconductor may be CdTe, in which case the absorption spectral peak may be near one of: 428 nm, 499 nm, 553 nm, and 598 nm. The semiconductor may be ternary CdSeTe, in which case the absorption spectral peak may be near one of: 430 nm, or 520 nm. The semiconductor may be CdP, and the bandgap photoluminescence absorption peak is near 455 nm.

The bandgap photoluminescent colloidal semiconductor nanocrystals may be CdSe doped with S or Zn, and preferably with S.

Also provided are bandgap photoluminescent colloidal semiconductor nanocrystals having group 12 and group VA elements in a ratio of 3:2 the nanocrystals being passivated by a surface-capping ligand. The semiconductor may be CdP.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which.

DESCRIPTION OF PREFERRED EMBODIMENTS

Synthesis of Nanocrystals

Figure 1:
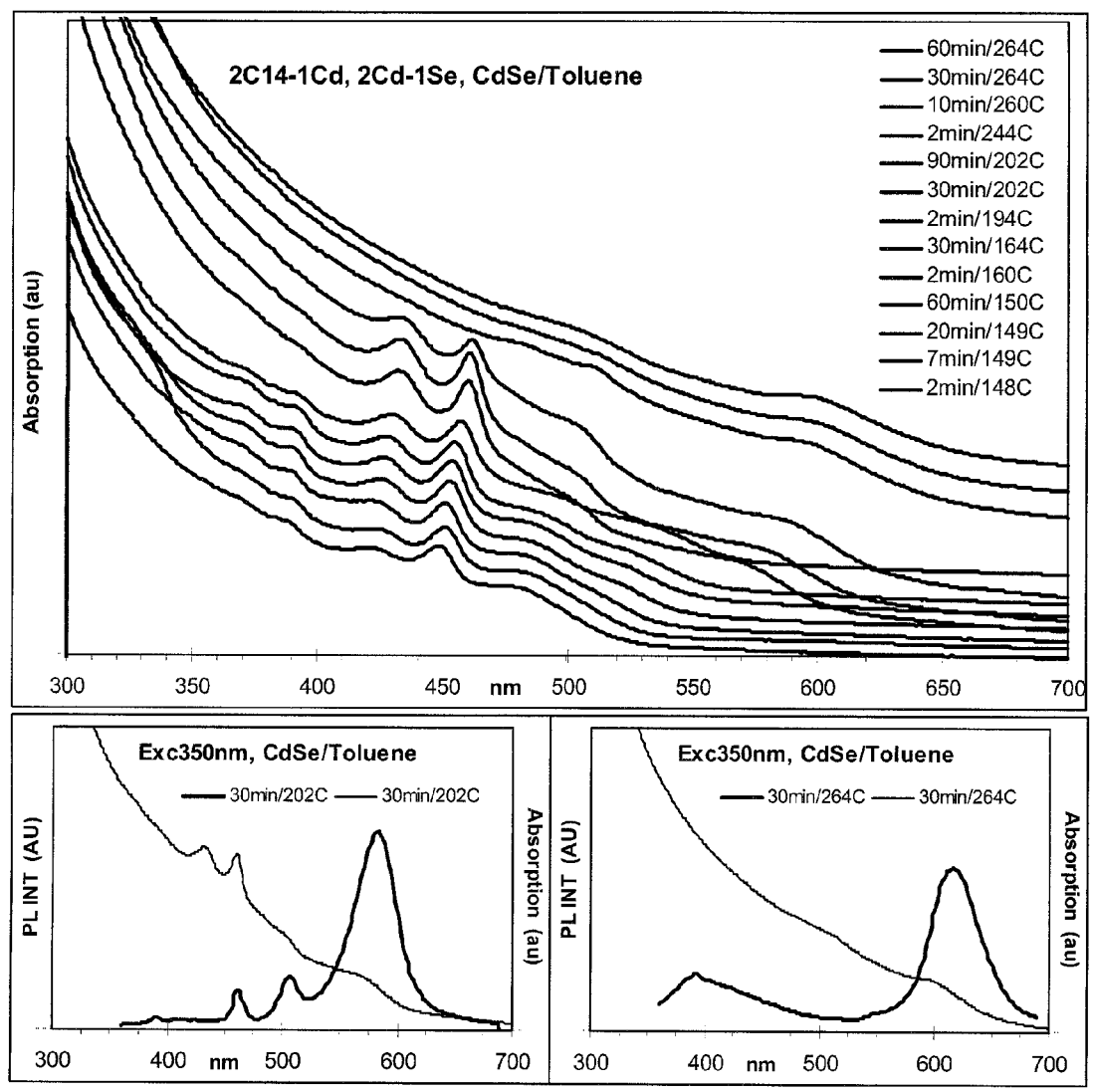
FIG. 1 includes graphs showing optical characterizations of ensembles of colloidal semiconductor nanocrystals produced using the present method with a 2:1 molar ratio of myristic acid to Cd under various crystal growth regimes.

Colloidal semiconductor nanocrystals and ensembles thereof of the present invention may be generally synthesized by contacting a source of at least one cation element (such as an element of Group 12 of the periodic table (i.e. Group IIB), namely Cd in the present examples) with a source of at least one anion element (such as an element of Group 15 (Group VA) or 16 (i.e. Group IVA) of the periodic table, in the presence of a ligand forming compound containing a carboxylic acid moiety in a reaction medium including a solvent that is substantially noncoordinating, at least with respect to the anion. The ligand forming compound and the source of at least one anion element have a molar ratio of substantially 1:1 or less, unlike previous methods of semiconductor nanocrystal formation.

Advantageously, the synthesis may be performed in a single pot without timed injection. The growth of the colloidal semiconductor nanocrystals is thermally controlled, and advantageously slow growth is possible, permitting high quality and uniformity of the colloidal semiconductor nanocrystals. Advantageously, specific conditions in the method may be controlled to provide substantially exclusively colloidal semiconductor nanocrystals of a single family (e.g. all nanocrystals having the same bandgap photoluminescence absorption peaks), obviating the need for further processing such as size-selective precipitation.

The cation element may be, for example, zinc (Zn), cadmium (Cd) or mercury (Hg), i.e., a Group 12 element. Cadmium is preferred. The source of the cation element is preferably a compound of a Group 12 element or a mixture of compounds. Compounds of Group 12 elements are preferably compounds containing monovalent groups bonded to the Group 12 element. Since the Group 12 elements are bivalent, there will be a 2:1 ratio of bonded group:Group 12 element in such compounds. One of the monovalent groups bonded to the Group 12 element should be labile enough to be replaceable by the ligand forming compound containing a carboxylic acid moiety. Some preferred monovalent groups include, for example, $C_1$-$C_3$ organic acids (e.g. formate, acetate, propionate). Particularly preferred is acetate. The source of Group 12 element may also include hydrates of the organic acid complexes of Group 12 elements. A very particularly preferred source of Group 12 element is cadmium acetate (Cd(OAc)$_2$) or cadmium acetate dehydrate (Cd(OAc)$_2$.2H$_2$O). The source of Group 12 element preferably has limited solubility in the reaction medium.

Preliminary investigations suggest that PbS semiconductor nanocrystals (Group 14/16) may also produced according to the present method, and it is known in the art to produce semiconductor nanocrystals from Group 11-14 semiconductor cations with one or more Group 15-17 semiconductor anions. For example, known combinations include CuIS, ZnSe, CdS, CdSe, CdTe, InP, HgS, HgTe, InAs, etc. It is expected that other semiconductor nanocrystals have yet to be produced, and these may equally be amenable to production via the present synthesis route.

The anion element may be from Group 16 of the periodic table, such as, sulfur (S), selenium (Se) or tellurium (Te). The source of Group 16 element may be elemental Group 16 element, a compound of a Group 16 element, a mixture of elements, a mixture of compounds, or a mixture of one or more elements and one or more compounds. The source of selenium or tellurium is preferably the elemental form, while the source of sulfur is preferably a compound. Where compounds are the source of Group 16 element, the compound should contain groups which are liable enough to leave the Group 16 element under the reaction conditions. Some examples of such groups include, for example, organosilyl groups (e.g. trimethylsilyl) and thioacetamido groups.

The anion element may be from group 15, such as phosphorus (P), and its source may be an organosilyl group such as tris(trimethylsilyl)phosphine ((TMS)$_3$P).

The ligand forming compound containing a carboxylic acid moiety is preferably a $C_8$-$C_{34}$ organic acid, e.g. saturated or unsaturated fatty acids or a derivative thereof. More preferably, the ligand forming compound has a chemical formula of $CH_3(CH_2)_n COOH$, where n is an integer from 6 to 28. Some specific examples of saturated fatty acids and derivatives thereof include butyric acid (butanoic acid, $CH_3(CH_2)_2COOH$), valeric acid (pentanoic acid, $CH_3(CH_2)_3COOH$), caproic acid (hexanoic acid, $CH_3(CH_2)_4COOH$), caprylic acid (octanoic acid, $CH_3(CH_2)_6COOH$), capric acid (decanoic acid, $CH_3(CH_2)_8COOH$), lauric acid (dodecanoic acid, $CH_3(CH_2)_{10}COOH$), myristic acid (tetradecanoic acid, $CH_3(CH_2)_{12}COOH$), palmitic acid (hexadecanoic acid, $CH_3(CH_2)_{14}COOH$), stearic acid (octadecanoic acid, $CH_3(CH_2)_{16}COOH$), arachidic acid (eicosanoic acid, $CH_3(CH_2)_{18}COOH$), behenic acid (docosanoic acid, $CH_3(CH_2)_{20}COOH$), lignoceric acid (tetracosanoic acid, $CH_3(CH_2)_{22}COOH$), 2-(n-hexadecyl)-stearic acid (($CH_3(CH_2)_{15})_2CHCOOH$) and 5-(4-biphenyl)valeric acid (Ph-Ph-$(CH_2)_4COOH$). Some specific examples of unsaturated fatty acids include myristoleic acid, palmitoleic acid, oleic acid, linoleic acid, α-linolenic acid, arachidonic acid, eicosapentaenoic acid, erucic acid and docosahexaenoic acid. Other ligand forming compounds containing a carboxylic acid moiety include, for example, tryptophan.

The ligand forming compound displaces one of the monovalent groups bonded to the Group 12 element, thereby increasing the solubility of the Group 12 element in the reaction medium. However, the increase in solubility is not too high, therefore the Group 12 element is only very slowly released into the reaction medium. The solubility is just sufficient to promote reaction with the source of Group 16 element while promoting controlled growth rate and improved selectivity of resulting nanocrystals.

Logically a short chain ligand-forming compound bound to the anion element and a long chain ligand-forming compound provided for substitution with the short chain ligand-forming compound may be inverted while providing equivalent post-binding solubility. It is considered likely that the inclusion of both a short chain (acetate) ligand-forming compound with a long chain ligand forming compound (e.g. $C_8$-$C_{34}$ organic acid) produce solubility properties that are beneficial for providing highly controlled reaction rates that permit thermodynamic selection to promote production of single size semiconductor nanocrystals at the expense of other nanocrystals.

The reaction medium comprises a noncoordinating solvent, at least insofar as the solvent is noncoordinating with respect to the cation. Noncoordinating solvents include, for example, liquid alkenes, alkynes or mixtures thereof. Alkenes are preferred, and $C_5$-$C_{12}$ alkenes are more preferred. 1-Octadecene (ODE) is particularly preferred. The reaction medium may contain small amounts of another solvent or a dispersant to help dissolve or disperse reaction components. Such other solvents or dispersants include, for example, trioctylphosphine (TOP).

The molar ratio of ligand forming compound with respect to the cation element is important. For every mole of ligand forming compound, there is one or more moles of the cation element. Thus, the molar ratio of ligand forming compound to cation element is 1 to 1 or less. Preferably, the molar ratio of ligand forming compound to source of cation element is in a range of from 1:1 to 1:10, more preferably in a range of from 1:1 to 1:8. For example, a molar ratio of 1:1.5 means that for every mole of ligand forming compound, there is 1.5 moles of anion.

Controlling the amount of anion element to cation element may also be done to help reduce dissociation of synthesized nanocrystals. The molar ratio of Group 12 element to Group 16 element is 1:1 or greater, more preferably in a range of from 1:1 to 10:1, even more preferably in a range of from 6:1 to 2:1. For example, a molar ratio 4:1 means that for every mole of Group 16 element there are 4 moles of Group 12 element.

Temperature may also be controlled to control growth of nanocrystals. The temperature is preferably maintained in a range of from about 90° C. to about the boiling point of the reaction medium. More preferably, the temperature is maintained in a range of from about 90° C. to about 290° C., or from about 90° C. to about 240° C., or from about 100° C. to about 250° C. The temperature may be constant throughout or a temperature change regime may be implemented.

Further, all or part of the synthesis may be accomplished in vacuo and/or under an inert atmosphere. Conducting at least part of the synthesis in vacuo permits efficient removal of volatile reaction products when the source of cation element reacts with the ligand forming compound. This helps reduce re-formation of the source of cation element thereby reducing the chance that this source material will precipitate, and interfere with the formation of the nanocrystals. Use of an inert atmosphere (e.g. nitrogen gas, argon gas) helps reduce the presence of reactive species like oxygen gas which could combine with the anions and cations to form undesirable precipitates that would also interfere with the formation of the nanocrystals.

The method of the present invention advantageously permits conducting the synthesis over longer periods of time (minutes to days) than prior art methods (seconds to minutes), thereby permitting longer growth/annealing periods at high temperature. For example, times from about 1 minute to about 30 days are possible. This results in higher quality nanocrystal ensembles that exhibit strong bandgap photoluminescence. Further, reproducibility and the ability to scale-up production are enhanced.

In a particularly preferred embodiment of the present method, cadmium acetate dihydrate is contacted with a source of at least one of sulfur, selenium, tellurium, or phospohorus in the presence of a $C_8$-$C_{32}$ saturated fatty acid at a temperature in a range of from 100° C. to 250° C. in a reaction medium comprising 1-octadecene in a molar ratio of fatty acid to cadmium acetate dihydrate of 1:1 or less. Conversely, the cadmium may be bound to the $C_8$-$C_{32}$ saturated fatty acid, and the source of sulfur, selenium, tellurium, or phospohorus may include acetate, as this would, logically provide equivalent solubility of the product.

Colloidal semiconductor nanocrystals produced by a method of the present invention may exhibit a bandgap photoemission peak at 370 nm or greater. Nanocrystals having a size of 2 nm or greater and having bandgap photoemission peaks at 400 nm or greater, or even 450 nm or greater are possible to make with the present method. The absorption spectra of nanocrystals produced by the present method may have linewidths on the order of about 10 nm (ternary colloidal semiconductor nanocrystals ensembles having about 20 nm FWHM linewidths), for example 10±7 nm, 10±4 nm or 10±3 nm. Nanocrystals may be passivated by a surface-capping group, for example, the ligand forming compound used in the method of producing the nanocrystals.

It is an advantage of the present method that "hot injection" processes may be avoided and that conditions may be adjusted to control the selectivity of different families of colloidal semiconductor nanocrystals. In general, shorter ligand forming compounds and lower temperatures favor formation of smaller nanocrystals, while longer ligand forming compounds and higher temperatures favor formation of larger nanocrystals. Further, by coupling specific thermal regimes to the natures of the source materials and the ligand forming compounds, it is possible to selectively produce nanocrystals with specific bandgap photoluminescence properties.

Example 1

Synthesis and Characterization of CdSe Colloidal Semiconductor Nanocrystals

A non-hot-injection, one-pot synthetic approach is used in which cadmium acetate dihydrate ($Cd(OAc)_2$·$2H_2O$) and elemental selenium are Cd and Se sources, respectively. A number of different saturated fatty acids having general formula $CH_3(CH_2)_nCOOH$, where n is 2, 4, 6, 8, 10, 12, 18, 20, 22 or 24, are used as to provide surface bound ligands. The reaction medium comprises 1-octadecene (ODE).

The following is a typical synthetic procedure. $Cd(OAc)_2$·$2H_2O$ (0.2 mmol), elemental Se (0.05 mmol), and fatty acid (0.133 to 0.05 mmol) in ODE (about 5.0 g) were loaded, at room temperature, into a 50-mL three-necked round bottom flask equipped with an air-cooled condenser. The reaction flask was heated up to 120° C. for 2-2.5 hours under stirring and vacuum (50 mTorr). Then, under a flow of purified nitrogen gas, the temperature was either raised directly to 240° C. at a rate of 10° C./min or increased in a stepwise manner with holding at several intermediate temperatures for a period of time. After a desired growth period aliquot samples were removed and dispersed in toluene for characterization. One or more of the parameters in this procedure may be changed as desired while still generally following the typical procedure.

The output of this process is an ensemble of colloidal semiconductor nanocrystals of one or more of 3 families.

FIG. 1 (upper panel) is a plot of absorption spectra of 13 samples taken from the three necked round bottom flask at respective time points taken while the temperature of the medium was held at one of 10 temperatures. The legend identifies the total time at the specified temperature for a corresponding plot. The order of the plots in the neighbourhood of 450 nm is the order of the legend.

For FIG. 1, myristic acid (C14) and $Cd(OAc)_2$·$2H_2O$ were used in a molar ratio of 2:1. The molar ratio of Cd:Se was 2:1. It was found that a relatively low amplitude, but still noticeable and narrow, doublet peak having a broad linewidth followed by a narrow linewidth peak is present near 463 nm. This narrow linewidth peak (and the doublet in the case of CdSe) appears to be a hallmark of a family of colloidal CdSe nanocrystals having a preferred size. There are also perturbations near 395 nm (especially in the first 7 nanocrystal ensembles produced) and 513 nm (especially in the $8^{th}$ to $10^{th}$ ensembles). The photoluminescence spectra (lower panels) taken from the $8^{th}$ (lower left panel) and $12^{th}$ (lower right panel) ensembles dispersed in toluene demonstrate the bandgap photoluminescences of these three families, although the 395 family is very weak, and could be mistaken for noise. The very broad line width peaks in the neighbourhood of 580-620 in the photoluminescence spectra indicate the concentration of ordinary quantum dots having the usual size distributions, which appear to represent a high proportion of the ensembles. From the steep decline in the narrow linewidth peaks after only 2 minutes at 244° C. and the subsequent irradiation of the peaks after 10 minutes at 260° C., it has been found that increasing temperatures generally improve the concentration of at least the 463 family until a temperature of 240° C. is met.

Figure 2:
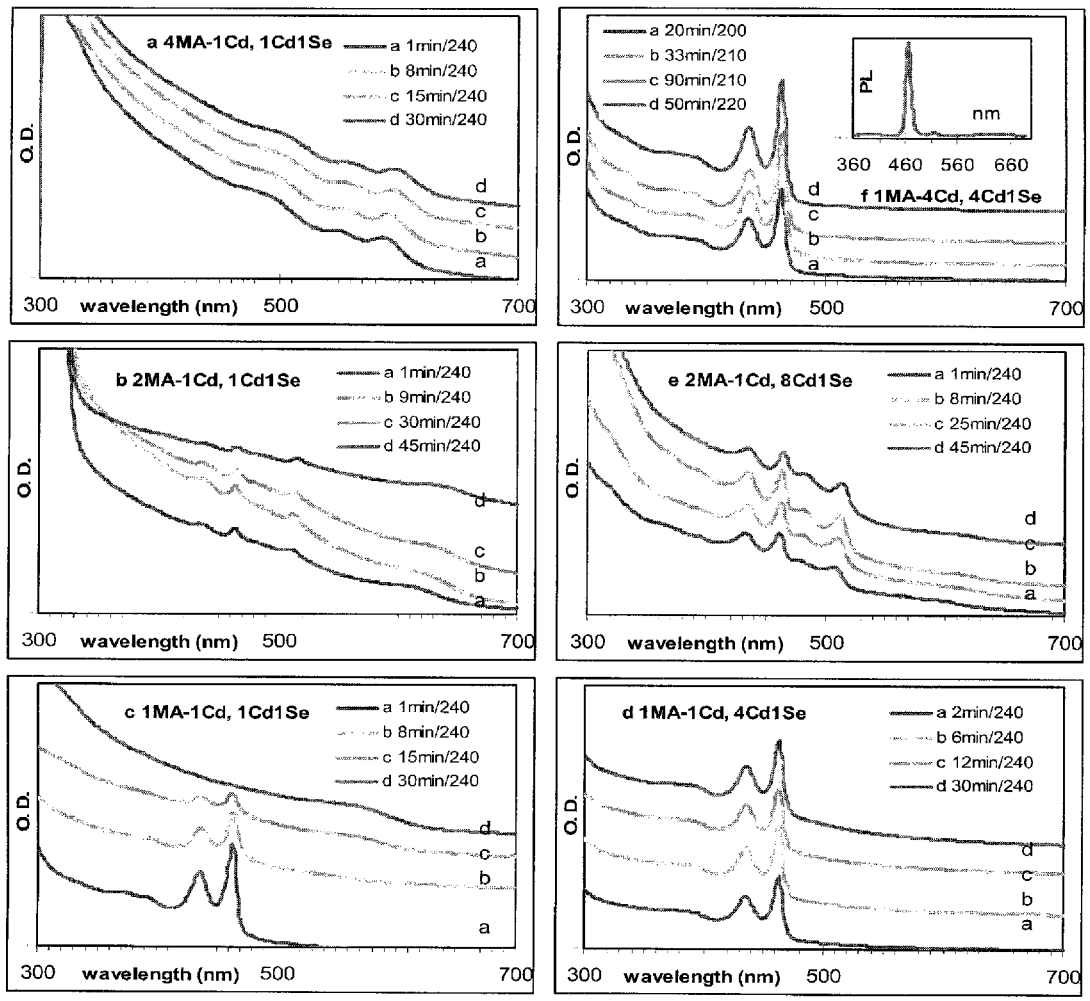
FIG. 2 includes graphs showing optical characterizations of ensembles of colloidal semiconductor nanocrystals produced using the present method with various molar ratio of myristic acid to Cd (2:1 to 1:4) under various crystal growth regimes, and with various Cd to Se molar ratios (1:1 to 8:1)

Referring to FIG. 2, a variety of different molar ratios of the fatty acid to Cd and Cd to Se were used. In FIG. 2 panels a-f show absorption spectra for respective experiments varying these parameters. The temperature of growth was held at 240° C. in each case, except for panel f, which used a variety of temperatures and durations for crystal growth. Each experiment consisted of 4 samples taken from the reaction medium at respective times indicated in the legend. The fatty acid used in these experiments was myristic acid (MA).

The absorption spectra shown in panel a represents comparative ensembles produced with 4:1 myristic acid to Cd, and 1:1 Cd to (elemental) Se. These ensembles do not show any doublet or narrow band absorption for any duration of crystal growth tested. These ensembles produced conventional size-distributed quantum dots.

The absorption spectra shown in panel b represents comparative ensembles produced with 2:1 myristic acid to Cd, and 1:1 Cd to Se. These ensembles show very small amplitude, narrow linewidth (10-14 nm) absorption peaks near 463 and 513 nm for all durations of crystal growth. The 9 minute crystal growth period produced the ensemble with the best defined peaks and the 45 minute period produced the ensemble with the least defined peaks. These ensembles produced quantum dots having a conventional size distribution (see influence in 610-650 nm region), but also began to show some preferential production of two families of colloidal CdSe nanocrystals.

The absorption spectra shown in panel c represents ensembles produced with 1:1 myristic acid to Cd, and 1:1 Cd to Se. These ensembles are mixed. At shorter periods, such as 1 minute, there is substantial production of a single family of colloidal CdSe nanocrystals evidenced by the narrow linewidth (~10 nm) absorption peak near 463 nm. When the process continued for 8 minutes, the peak is roughly half in amplitude suggesting a corresponding reduction in the number of colloidal CdSe nanocrystals, which were later disbanded and used to form any sized nanocrystals. After 7 more minutes the peak is roughly reduced again by about ⅓, and by 30 minutes, none of this peak is manifest. This suggests a regime useful for producing exclusively this 463 family of colloidal CdSe nanocrystal is with the temperature of 240° C. for a period less than 8 minutes (more likely less than 5 minutes) with a fatty acid in the form of myristic acid, although this may not be optimized. While some time dependence in production may be advantageous, strong time dependence requires expensive thermal control that grows rapidly with size.

The absorption spectra shown in panel d represents ensembles produced with 1:1 myristic acid to Cd, and 4:1 Cd to Se. These ensembles show similar amplitude absorption peaks near 463 nm, substantially independently of the duration of the crystal growth period between 2 and 30 minutes. The yield of colloidal CdSe nanocrystals is therefore substantially independent of this time, although it appears that there is a slightly higher peak at 6 minutes.

The absorption spectra shown in panel e represents ensembles produced with 2:1 myristic acid to Cd, and 8:1 Cd to Se to demonstrate which of the two factors acid to Cd or Cd to Se has the more direct impact on growth rates. These ensembles show narrow linewidth absorption peaks near 463 nm and near 513 nm for all times sampled, just as the panel b ensembles. The increase in Cd to Se molar ratio clearly improves the numerical yield of colloidal CdSe nanocrystals, but does not improve single family selection. In terms of time sensitivities and the rates of formation and disbanding of the colloidal CdSe nanocrystals of these families, it is noted that they appear to do so in lockstep in that the amplitudes of the two peaks rise and fall together. The peak generation of the colloidal CdSe nanocrystals of these families appears to be closer to 25 minutes than 8 minutes.

The absorption spectra shown in panel e represents ensembles produced with 1:4 myristic acid to Cd, and 4:1 Cd to Se showing a variety of temperature regimes. The ensemble having the highest absorption peak was produced at 220° C. for 50 minutes and corresponds with plot d, and the other ensembles were produced at lower temperatures. The ensemble exhibiting the absorption spectrum of plot d has a bandgap photoluminescent spectrum as shown in the inset graph.

Figure 3:
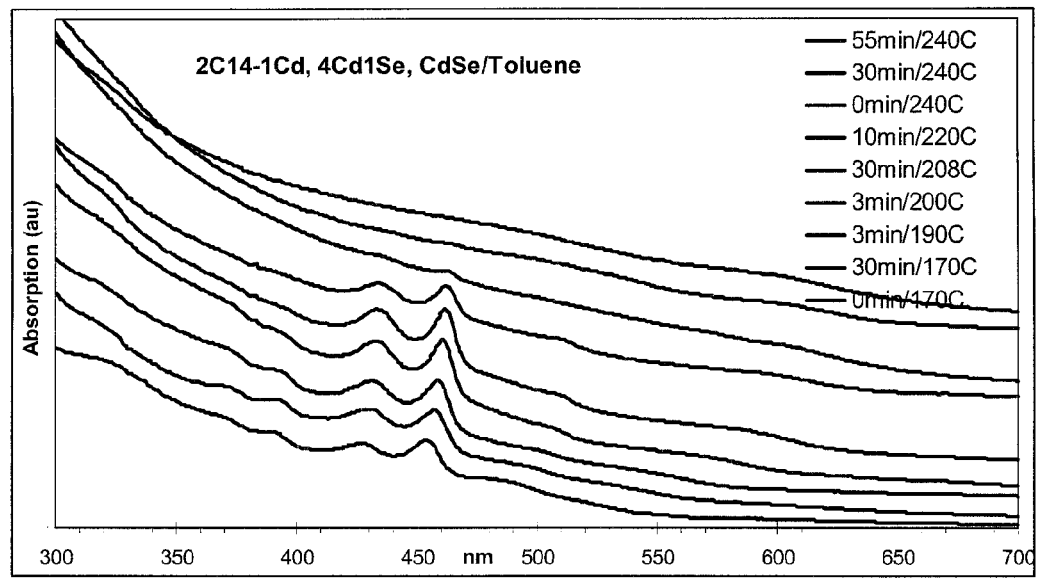
FIGS. 3 and 4 are graphs showing optical characterizations of ensembles of colloidal semiconductor nanocrystals produced using the present method demonstrating the importance of the molar ratio of acid to Cd.
Figure 4:
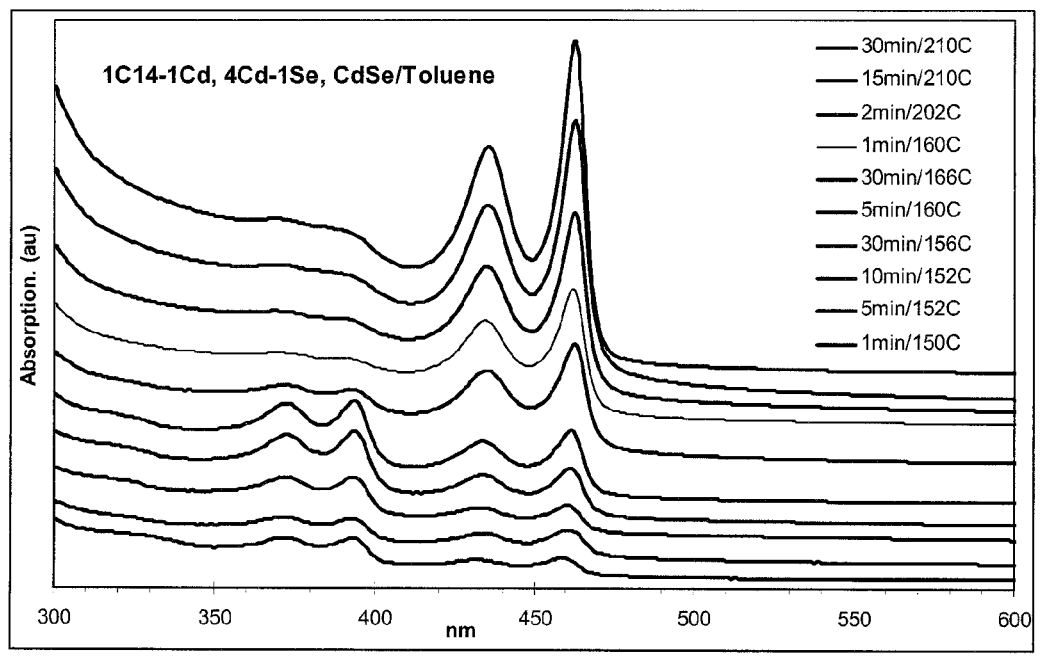

FIGS. 3 and 4 confirm that the selection of a low acid to Cd molar ratio, especially coupled with a high Cd to Se molar ratio greatly improves yield of family 463 (and at lower temperatures family 395) at the expense of the usual assortment of quantum dots that exhibit broadened photoluminescent emission in the neighbourhood of 600 nm.

Figure 5:
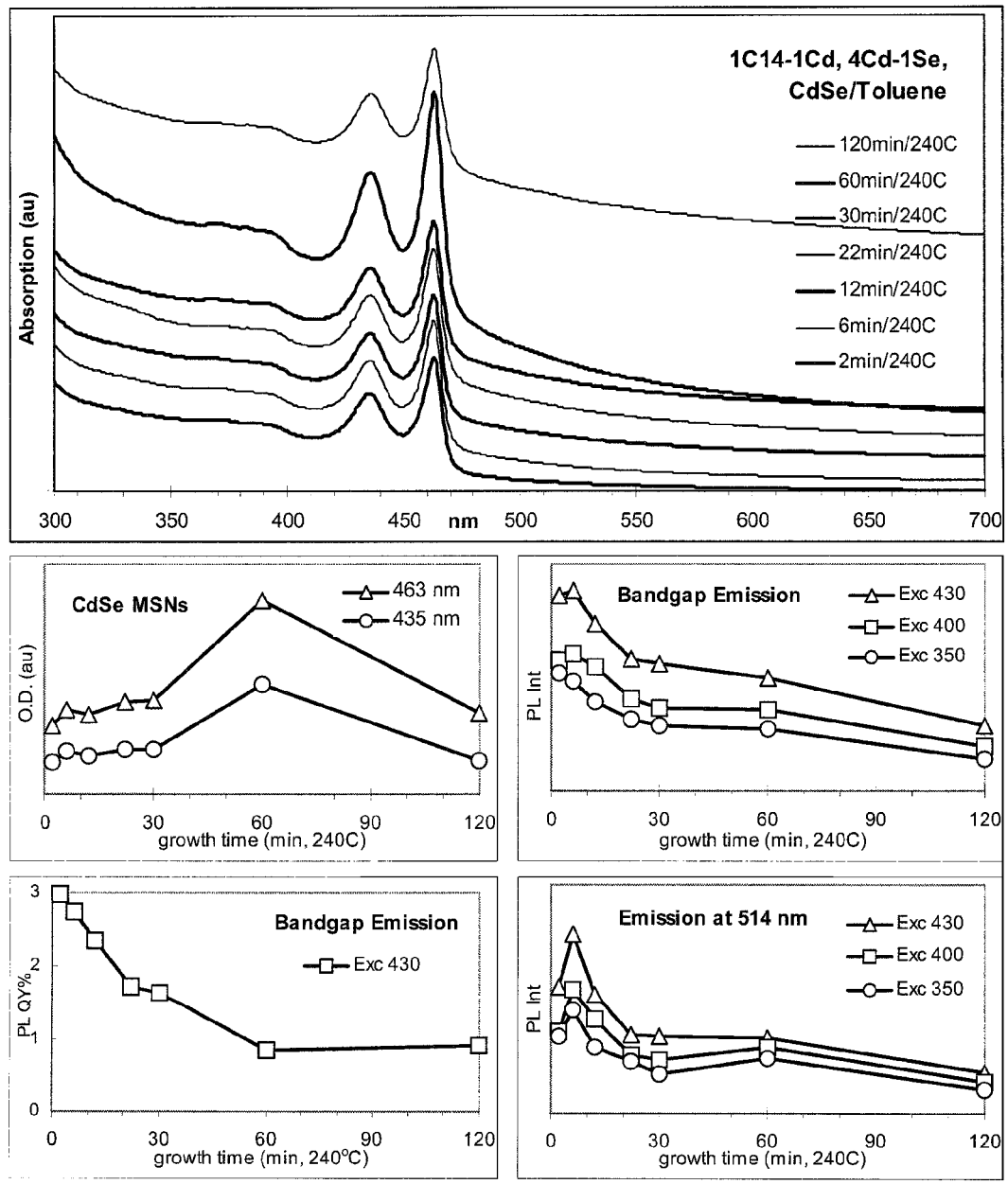
FIGS. 5 and 6 include graphs showing optical characterizations of ensembles of colloidal semiconductor nanocrystals produced using the present method showing quantum yield of ensembles.
Figure 6:
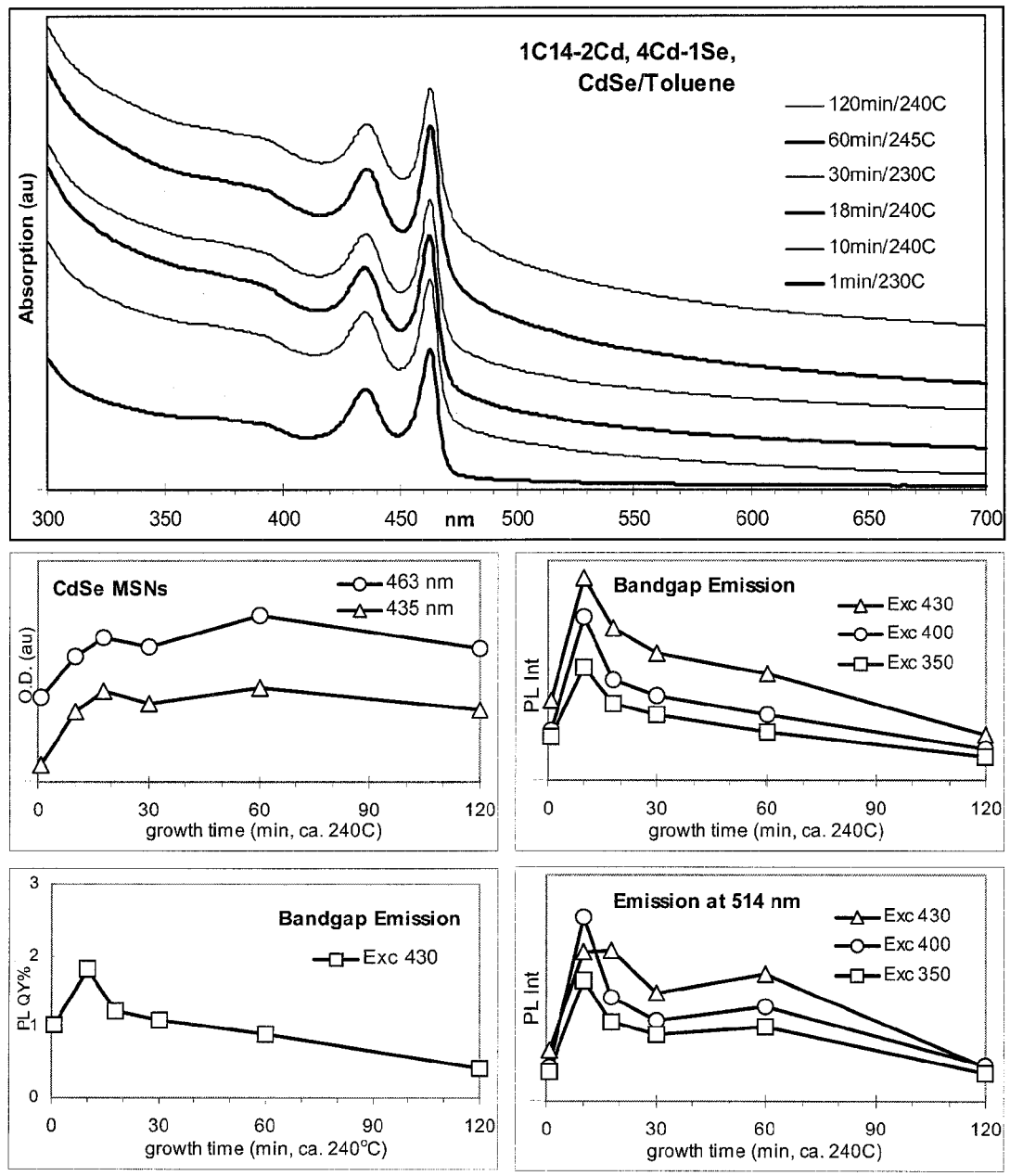

FIGS. 5 and 6 show Quantum Yield analyses showing that 1 myristic acid to 1 Cd, to 1 myristic acid to 2 Cd produce similar yields. The temperature was substantially fixed at 240° C. and samples were removed from the flask at a variety of times indicated in the legend.

It will be noted that there are significant similarities between these two sets of ensembles. In both cases, the maximum yield of 463 family colloidal CdSe nanocrystals is achieved at about 60 minutes. This optical density (OD) is determined from the heights of the amplitudes of the peaks (relative to their baselines) of the absorption plots (top panels) and is plotted as a function of time in the middle left panels.

It is noted that the 1:1 myristic acid to Cd example of FIG. 5 exhibits much stronger time sensitivity than the 1:2 myristic acid to Cd example of FIG. 6, which produces a relatively constant yield of the 463 family at all times. It is also evident from the smoothness of the curves in the 600-700 nm region that both of these examples produce fairly pure 463 family colloidal CdSe nanocrystals at substantially all temperatures.

Interestingly, the bandgap emission peak intensities indicate that the highest intensities of bandgap photoluminescence is exhibited at about 6 minutes in FIG. 5 and at about 10 minutes in FIG. 6. In both of these cases there are substantially more 463 family colloidal CdSe nanocrystals produced at a later time, but the quantum yield of those that are subject to longer crystal growth durations are significantly lower. The quantum yield (QY) is the ratio of optical density (OD) to photoluminescence (PL) intensity and is plotted on the lower left hand panels.

In FIG. 5 the QY is best at 2 minutes of growth, and in FIG. 6 it is shown that QY is better at 10 minutes than at 1 minute, but in both cases the best QYs are far earlier than the peak OD. In both ensembles, family 513 colloidal CdSe nanocrystals are also produced, and their respective PL intensities are plotted in the lower right panels of each of FIGS. 5 and 6. It is noted that these colloidal CdSe nanocrystals were not observable in the absorption spectra of the top panels.

Figure 7:
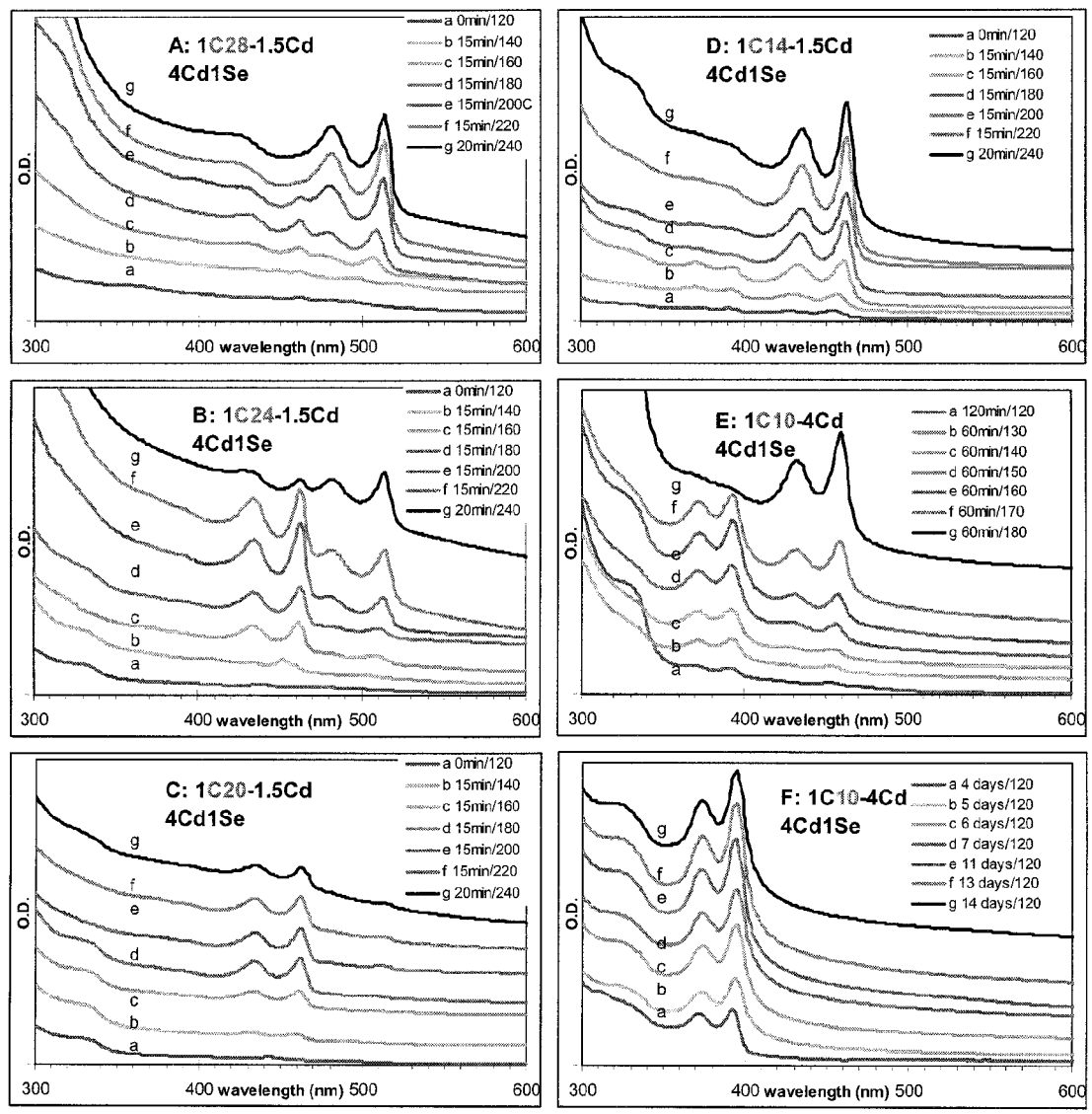
FIGS. 7, 8 and 9 are graphs showing optical characterizations of ensembles of colloidal semiconductor nanocrystals produced using the present method showing a variety of ligand forming fatty acids.

FIG. 7 shows how variation of the length of the fatty acid and growth temperature changes the ensemble composition with regards to the preferential production of families of colloidal CdSe nanocrystals. Six panels showing absorption spectra of ensembles produced with respective fatty acids are shown, each panel showing 7 absorption spectra of ensembles obtained with different thermal regimes. In these experiments the ensembles were produced with source material molar ratios of 1 acid to 1.5 Cd, and 4 Cd to 1 Se, except in panels E and F where the molar ratios of acid to Cd is 1:4.

Panel A plots absorption spectra of ensembles produced with ligands of the formula $CH_3(CH_2)_{26}COOH$. The ensembles analyzed in plots b-f were produced with 15 minute crystal growth periods at five 20° C. temperature intervals from (140° C. to 220° C.). Plots a (0 minutes at 120° C.) and b show substantially no production of any particular size colloidal CdSe nanocrystals, as there is no substantial peak. Plots c, d and e show some production of both the 513 and 463 colloidal CdSe nanocrystal families, with d showing the highest production of the latter. While the production of the 463 family drops off at temperatures above 180° C., the 513 family continues growing with increased temperature, at least until 220° C. Plots f and g (20 min at 240° C.) show substantially no production of the 463 family and good production of family 513 in exclusion. Slightly higher amplitude absorption peaks are observed in the plot f. In general the higher the temperature and the longer the growth period, the more production of family 513 is observed.

Panel B plots absorption spectra of ensembles produced with ligands of the formula $CH_3(CH_2)_{22}COOH$. The ensembles analyzed in plots a-g were produced with the same growth regime as in panel A. Plots a and b show substantially no production of any particular size colloidal CdSe nanocrystals, as there is no substantial peak of narrow linewidth. Plots c through g all show production of both 463 family, with e showing the highest production. While the production of the 463 family drops off at temperatures above 200° C., it is substantially diminished for the ensemble produced at 240° C. Plots e through g show production of the 513 family, with increasing production at higher temperatures. It is therefore possible to produce different ratios of families of colloidal CdSe nanocrystals by simply varying the duration of the growth period. In general, lower temperatures favour production of smaller families over larger families.

Panel C plots absorption spectra of ensembles produced with ligands of the formula $CH_3(CH_2)_{18}COOH$. The ensembles analyzed in plots a-g were produced with the same growth regime as in panel A. The plots a and b show no substantial peaks. Plots c through g show the gradual rise and fall of family 463 production. The production appears to peak between 180° C. and 200° C. Substantially no other family appears to have been produced.

Panel D plots absorption spectra of ensembles produced with ligands of the formula $CH_3(CH_2)_{12}COOH$. The ensembles analyzed in plots a-g were produced with the same growth regime as in panel A. The plots a and b show no substantial peaks. Plots c through g show the sustained rise of family 463 production, exclusively. The peak absorption is very high with temperatures between 220° C. and 240° C. Substantially no other family appears to have been produced.

Panels E and F plot absorption spectra of ensembles produced with ligands of the formula $CH_3(CH_2)_3COOH$. The ensembles spectrally analyzed in plots Ea-g and Fa-g are produced with different temperatures and longer growth periods. For temperatures below 140° C. it is clear that little of either family is produced within one hour. For temperatures from 150° C. to 170° C. (1 hour duration), some production of family 463, to a lesser extent, and another family of colloidal CdSe nanocrystals that has a narrow linewidth in the neighbourhood of 395 nm is manifest. The greatest yield of family 395 appears to be at around 160° C. for 1 hour intervals. The family 463 production continues to increase beyond 160° C., and at a temperature of 180° C. substantial production of the 463 family is noted, and no production of the 395 family is found. As shown in panel F, at the low temperature of 120° C., over a period of 4-14 days, growth of family 395 to the exclusion of family 463 occurs. After the $7^{th}$ day, the peaks are substantial. Thus the same source materials and equipment can be used to produce substantially high yield single families of colloidal CdSe nanocrystals. At temperatures intermediate 120 and 140° C. the family 395 colloidal CdSe nanocrystals can be produced more rapidly.

Figure 8:
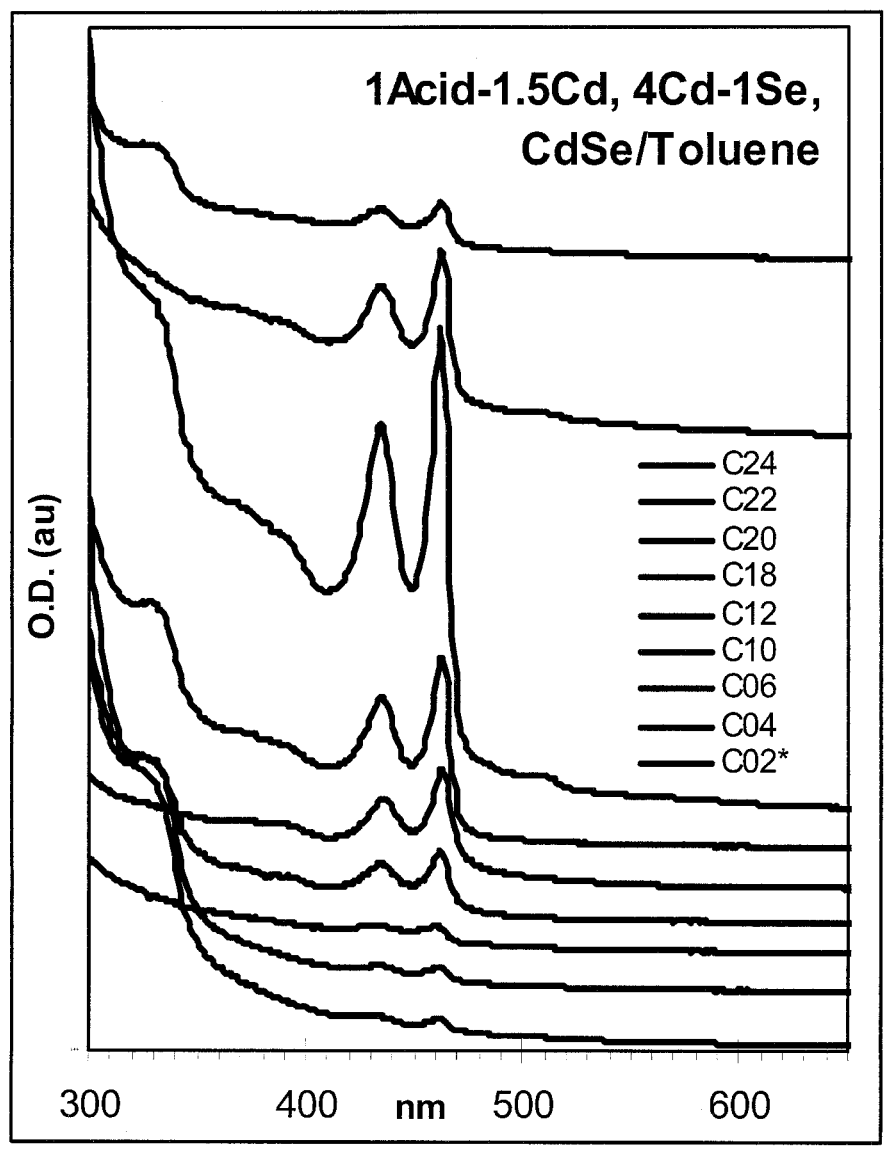

FIG. 8 plots optical density (OD) for ensembles of the 463 family synthesized using C2, C4, C6, C10, C12, C18, C20, C22, and C24 carboxylic acid ligands. The molar ratios of the reactants are 1 acid to 1.5 Cd and 4 Cd to 1Se, and the process was conducted at a maximum temperature of 240° C. with a growth period of 0 minutes. The order of the plots is the same as the order of the acids listed in the legend. It is noted that for this crystal growth regime, C18 demonstrates the highest production of the 463 family colloidal CdSe nanocrystals, and that at least for C>6 there is some production of the 463 family.

Figure 9:
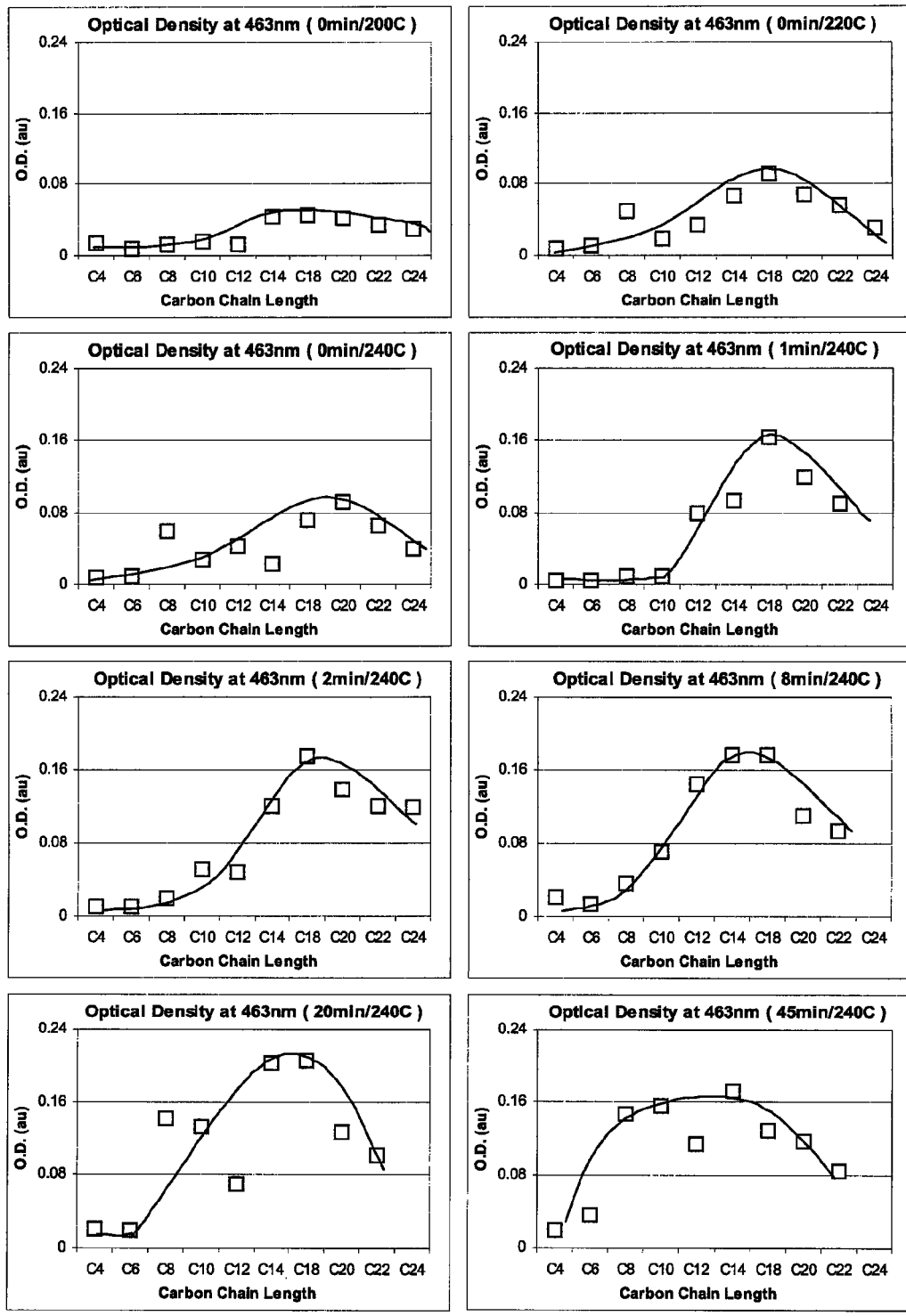

FIG. 9 consists of 8 panels showing ODs of ensembles of colloidal CdSe nanocrystals synthesized using C4, C6, C8, C10, C12, C14, C18, C20, C22 and C24 carboxylic acid ligands. It is noted that in the first 3 panels (0 minute growth periods), an increase in temperature from 200° C. to 220° C. has a considerable effect on production of the 463 family, and that subsequent increase to 240° C. has less impact. As the temperature was increased, the ligand that led to maximum nanocrystal growth changed from about C14, to C18 and then to C20.

The remaining 5 panels show the impact of increasing growth periods for a temperature of 240° C. on production of the 463 family. Generally ligands C14 and C18 produce the greatest numbers of family 463 colloidal CdSe nanocrystals. It is noted that particularly high 463 family production occurred for 20 minute growth time.

Figure 10:
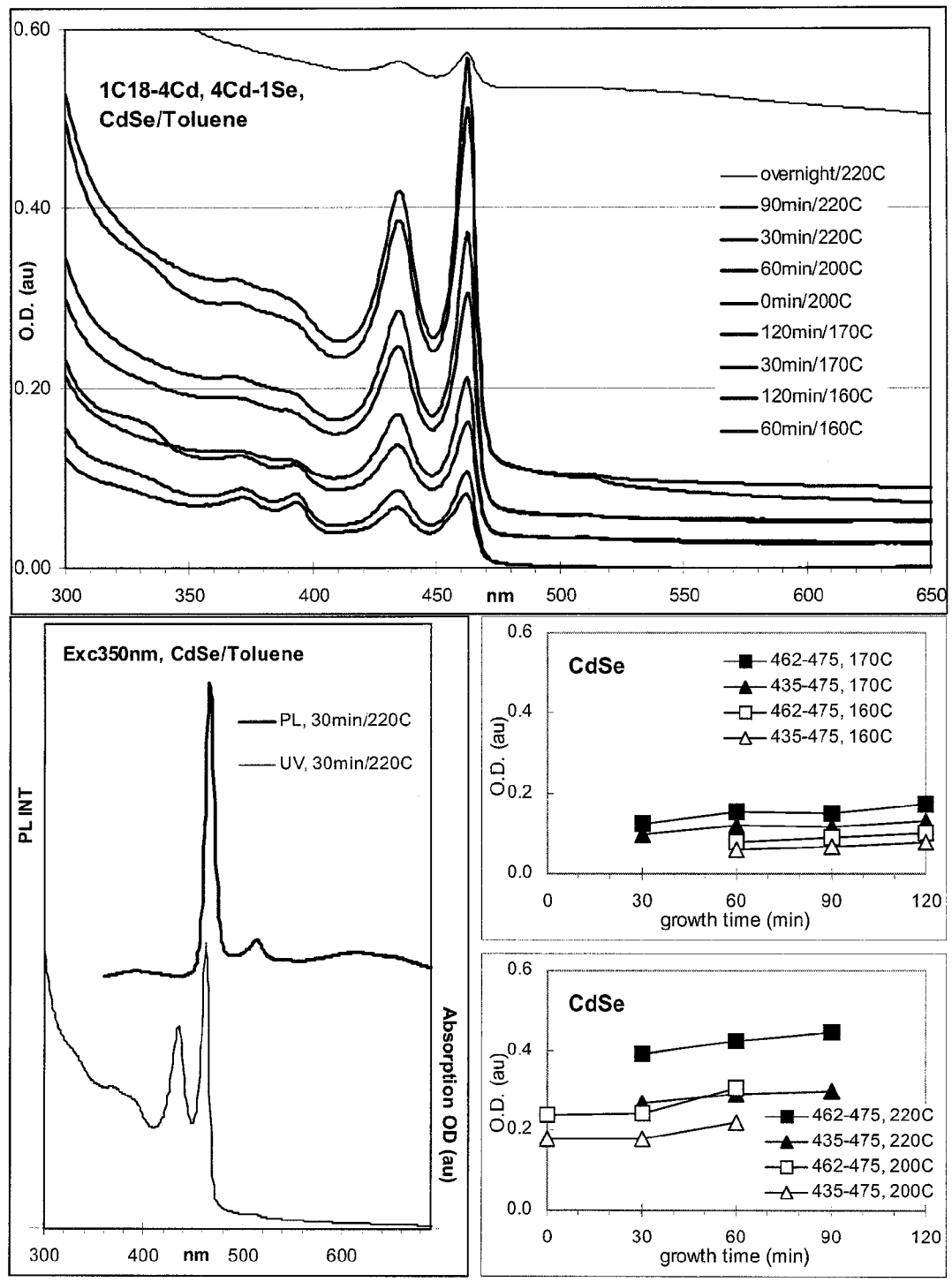
FIG. 10 is a graph showing optical characterization of ensembles of colloidal semiconductor nanocrystals demonstrating a time sensitivity and temperature sensitivity of the present method.

FIG. 10 shows the absorption curve (top), photoluminescent emission spectrum (left), and ODs (right top and bottom) for ensembles produced and sampled after various increasing temperature conditions identified in the legend of the top panel. The ligand is C18 carboxylic acid, and the highest OD computed (~0.045) was for a growth temperature of 220° C. for 90 minutes. There is a substantial improvement in OD exhibited by the ensembles produced above 200° C. (lower right panel) in comparison with those below this temperature (middle right panel).

Figure 11:
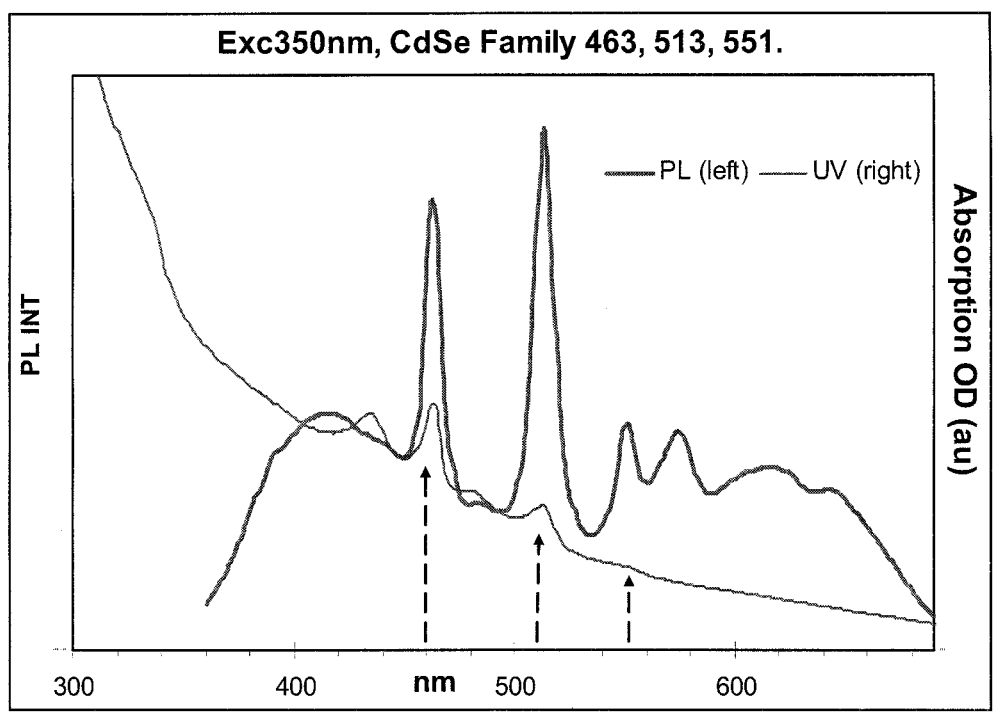
FIG. 11 is a graph showing optical characterizations of ensembles of a larger size CdSe family.

By varying the parameters of the process described above, other larger diameter single size families of colloidal CdSe nanocrystals can be produced. FIG. 11 plots absorption and photoluminescent response curves of an ensemble including considerable populations of family 463 and family 513, as well as a smaller amount of a family 551. Given that considerable fraction of the production was taken up by the family 463 and 513 colloidal CdSe nanocrystals in this ensemble, and given that it has been shown that varying the ratios of the source compounds, temperature regimes, etc. can throttle production of some families without affecting others.

The specific ensemble spectrally analyzed in FIG. 11 was produced with molar ratios of 1 C28 carboxylic acid to 1.875 Cd and 5Cd to 1Se, and the temperature regime was a 50 min growth period at 220° C.

Figure 12:
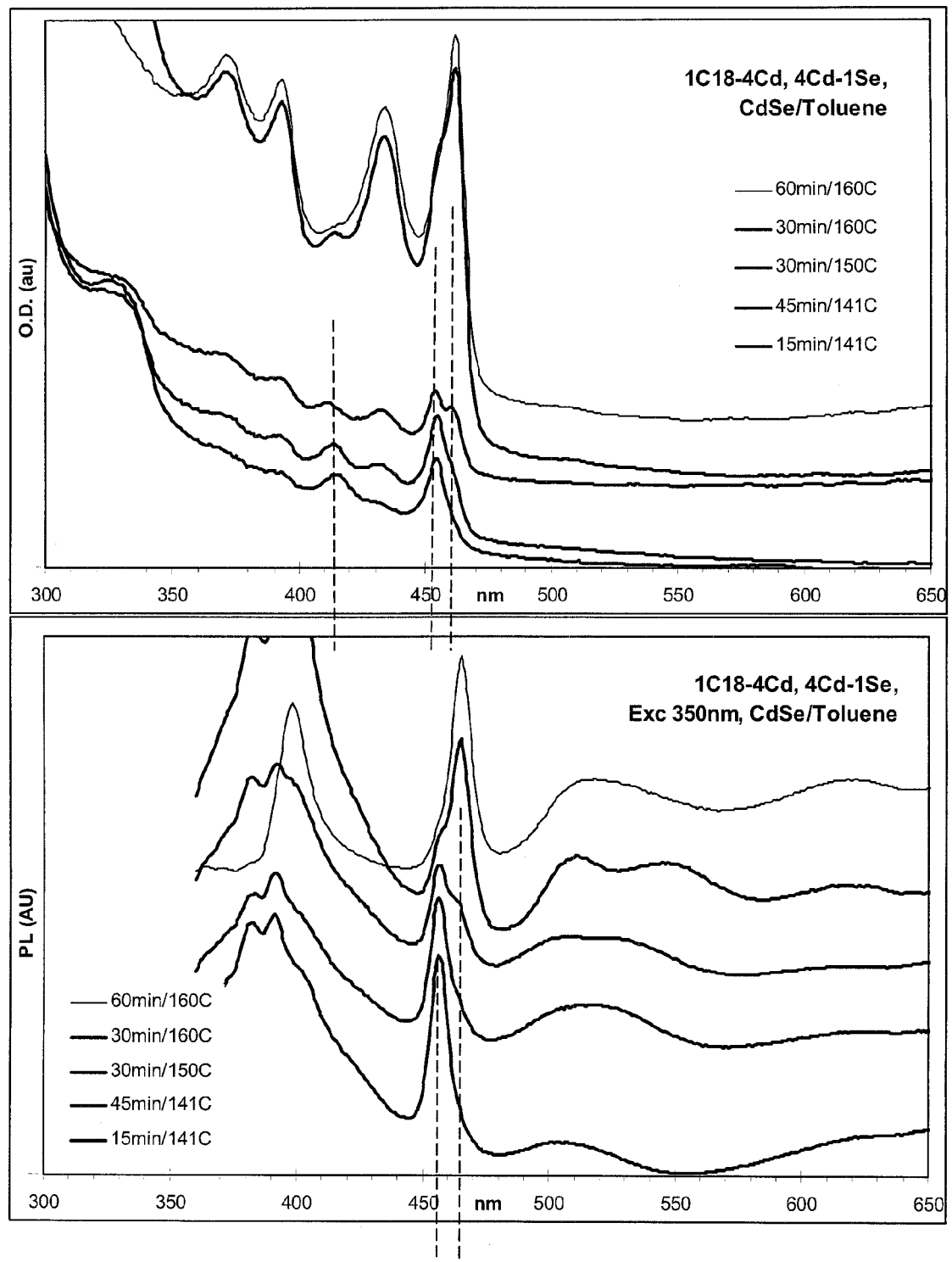
FIG. 12 is a graph showing optical characterization of ensembles of an intermediate size CdSe family.

FIG. 12 contains plots of ensembles produced using C18 carboxylic acid for ligand formation, and a temperature regime from 141° C. to 160° C. It is noted that the carboxylic acid was (saturated) stearic acid, and not oleic acid. Both absorption curves (top panel) and bandgap photoluminescence emission spectra (bottom panel) are shown. Both these curves show the presence of two peaks. The higher energy peak is within about 10 nm of the 463 family peaks, and seems to disappear quickly in the production process.

Figure 13:
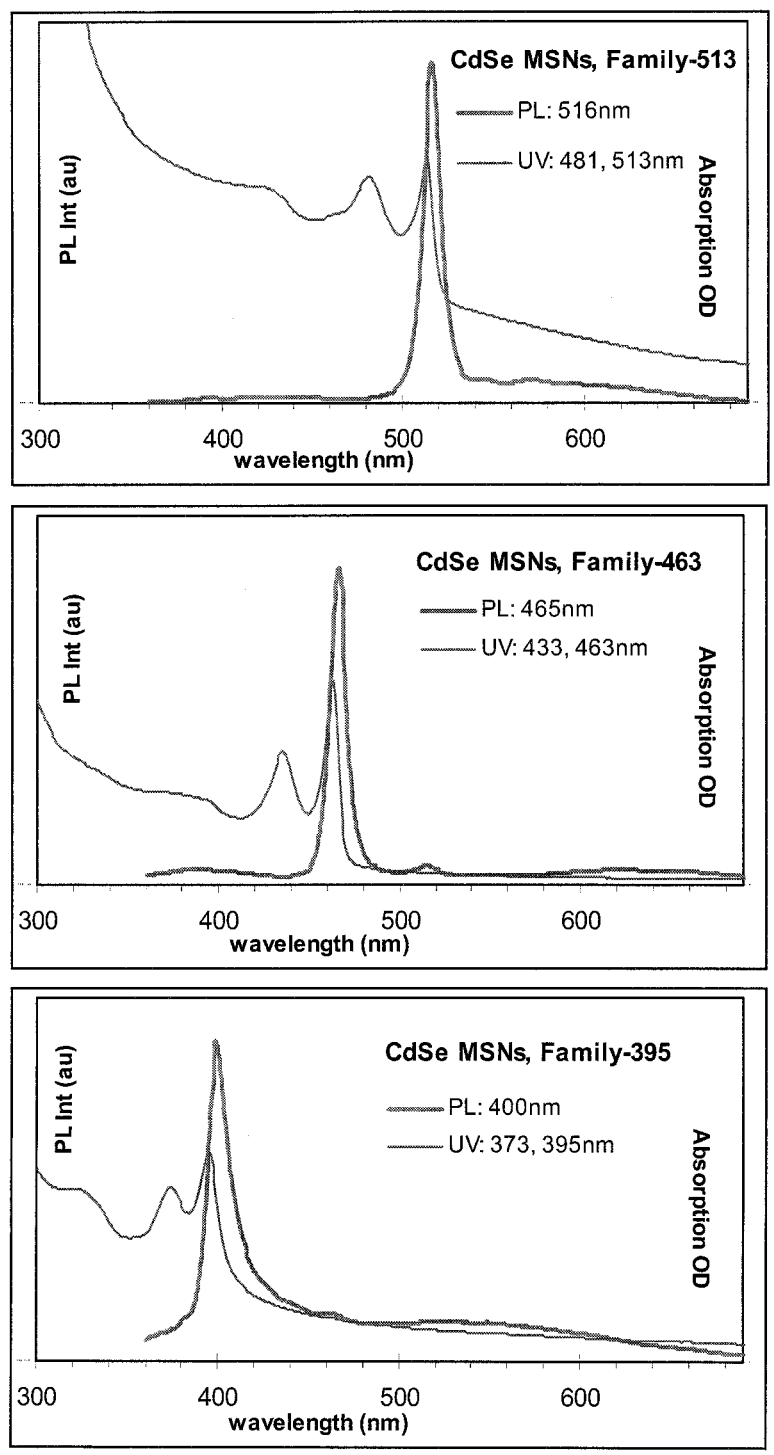
FIG. 13 are graphs showing optical characterizations of ensembles featuring of 3 CdSe families.

FIG. 13 shows three pairs of absorption and photoemission plots for three families of colloidal semiconductor nanocrystals that have been produced in substantial isolation. The absorption (thinner lines, higher amplitude to the right) and photoemission (thicker lines, more strongly peaked) spectra of the three families of CdSe colloidal semiconductor nanocrystals when dispersed in toluene. The top graph represents wavelength response of Family 513, the middle graph represents wavelength response of Family 463, and the bottom graph represents wavelength response of Family 395. These families are named by their $1^{st}$ absorption peak position.

Nanocrystal Characterization

It is noted that there is a characteristic doublet absorption with the larger amplitude peak substantially aligned with the emission peak. The emission peak is slightly (0-2 nm) red-shifted with respect to the larger absorption peak in each case in accordance with the non-resident Stokes shift.

Optical methods are well established analytical techniques for assessing colloidal samples without extensive and potentially property-altering sample preparation. Although optical characterization can provide only limited structural information, optical methods are routinely used for size determination of nanocrystals. Consequently, we based our assessment of the size and size distribution of the colloidal semiconductor nanocrystals on analysis of their absorption and emission spectra.

The band edge non-resonance photoluminescence (NPL) of the colloidal semiconductor nanocrystals have narrow bandwidths (FWHM), typically observed in the past in single dots rather than in ensembles. For the colloidal semiconductor nanocrystal family emitting near 2.67 eV (465 nm), we observed, at room temperatures, the NPL band as narrow as 44(1) meV (7.6(2) nm). Instrumental broadening did not exceed a few tens of a nanometer. Similarly, a band edge absorption band as narrow as 49.2(8) meV (8.5(2) nm) with a maximum at 2.68 eV (463 nm) has been observed. Instrumental broadening was somewhat larger than for the NPL band and approximately equal to 0.5 nm. The widths of the band edge absorption and emission bands of our colloidal semiconductor nanocrystals are typically more than 2 to 4 times smaller than NPL and absorption ensemble widths previously reported in literature.

The colloidal semiconductor nanocrystal family emitting at 465 nm with the first absorption peak at ~463 nm, corresponds to nanocrystals with a diameter of ~2.05 nm, as determined using a formula of Yu et al. (Yu, W. W.; Qu, L.; Guo, W.; Peng, X. *Chem. Mater.* 2003, 15, 2854-2860) and assuming that the formula is applicable for nanocrystals having a diameter of 2 nm. Taking the 30 meV as the single dot emission bandwidth and assuming that the additional broadening (~14 meV) in our nanocrystal NPL spectrum exclusively results from size distribution, we estimate, again using the formula of Yu et al., the maximum size distribution of the nanocrystals to be of the order of 0.018 nm. It should be pointed out that for small diameter (2 nm) CdSe quantum dots, band gap energy varies very strongly with diameter; thus, the spectral broadening due to size distribution is much more pronounced in small dots than in large dots with comparable broadening (in nm). To estimate the size distribution in terms of a number of atoms we assume that the volume of the nanocrystal is proportional to the number of its atoms and conclude that $(\Delta N)/N=3(\Delta d)/d$, where N is the number of atoms in a nanocrystal and d a diameter of the nanocrystal. Taking the total number of atoms in a CdSe nanocrystal having a diameter of 2 nm to be equal to 144 (Fernando, M. Yu, G. W.; Papadimitrakopoulos, R. Li, F.; Shi, N.; Ramprasad, R. *J. Computer-Aided Mater Des.* 2007, 14, 167), we estimate the maximum size distribution in terms of a number of atoms to be equal to 3.8. Giving that the 30 meV room temperature homogeneous width of our nanocrystal is probably a gross underestimation, or rather the 14 meV size distribution (heterogeneous) broadening is a gross overestimation (spectral diffusion, instrumental broadening, and other factors likely contribute as well to the total observed width), we conclude that the actual size distribution in terms of a number of atoms is no more than a few atoms and possibly as small as 1-2 atoms. Thus, our nanocrystal ensembles are truly monodispersed nanocrystal ensembles.

In fact, our colloidal semiconductor nanocrystal NPL ensemble bandwidth is similar to a single dot room temperature minimum emission bandwidth (50 meV) reported by Schlegel et al. (G. Schlegel, G.; Bohnenberger, J.; Potapova, I.; Mews, A. *Phys. Rev. Lett.* 2002, 88(13), 137401) for ZnS-covered CdSe quantum dots. However, most of the single dot emission spectra they observed were considerably broader. They also detected spectral fluctuations in a single dot spectrum of the order of 20 meV, and thus concluded that a homogeneous single dot bandwidth may still be smaller than 50 meV.

Investigation of photoluminescence (PL) lifetime of family 463 (at emission 465 nm) wa studied using 455 nm excitation of an ensemble dispersed in toluene under frequency domain measurements. Colloidal CdSe nanocrystals ensembles exhibited multi-exponential PL lifetimes at emissions of 465 nm. The majority component (74%) is short, on the order of one to two hundred picoseconds (ps), and the minor component (26%) is long, around 80 nanoseconds (ns).

Figure 14:
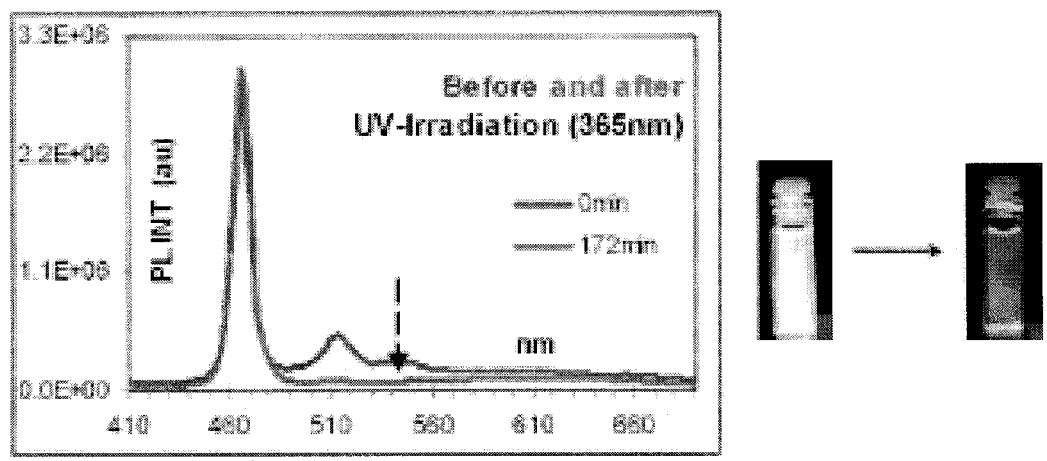
FIG. 14 includes a photograph and graphs showing purification by UV irradiation.

UV irradiation has proven an effective means for eliminating non-bandgap emission from the photoemission spectra of ensembles having the 463 family. More specifically, emissions on the red side of the bandgap emission at 465 nm can be removed resulting in a more pure 465 nm emission. FIG. 14 (left panel) shows a photoluminescent spectra before and after 172 minutes of exposure to a UV-lamp emitting at 365 nm, in which the peaks at 513 nm and above were substantially attenuated. After irradiation treatment, a pure blue light characteristic of family 463 remains. This is illustrated in FIG. 14 (right panel) where the cuvette on the right glows blue, which is illustrated as a darker shade of grey compared to cuvette on the left.

Figure 15:
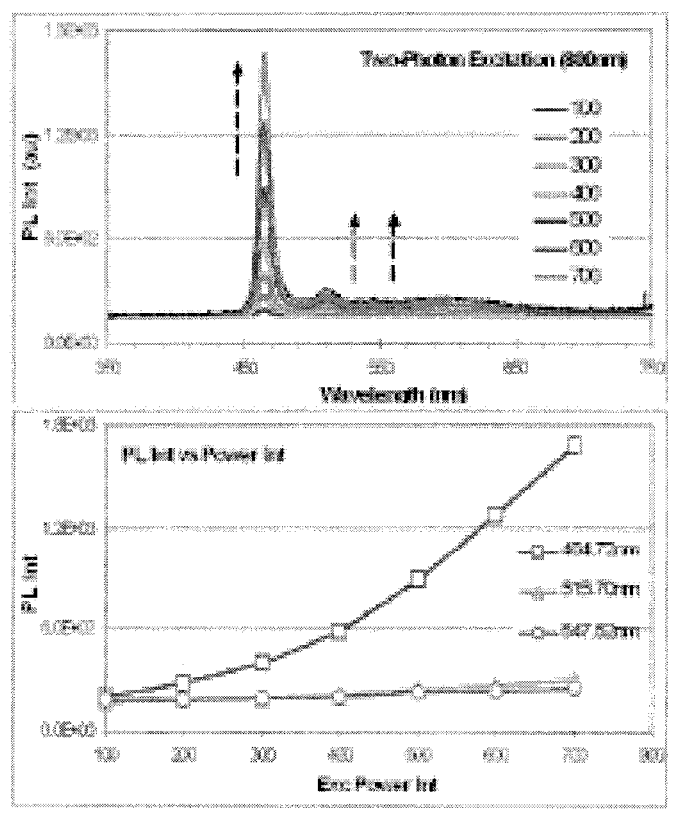
FIG. 15 are graphs showing two photon excitation of one family of CdSe colloidal semiconductor nanocrystals.

FIG. 15 shows that the ensemble of family 463 colloidal CdSe nanocrystals exhibits two photon excitation. The top panel shows two photon excitation as a function of excitation (800 nm) power. The bottom panel plots power dependence of photoemission. A power dependence of photoluminescent emission by two photon excitation is a useful property for detection. Family 463 nanocrystals exhibit different power dependence of its bandgap emission at 465 nm as compared to that at 515 nm and 548 nm.

Figure 16:
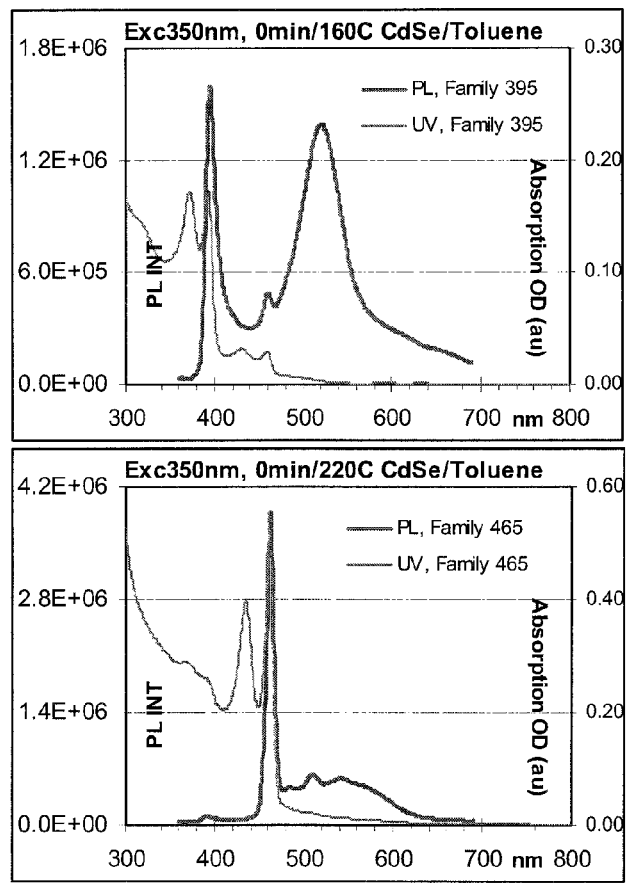
FIG. 16 are graphs showing CdSe ensembles produced with the addition of a small amount of a known dispersant coordinating with Cd and Se.

FIG. 16 shows the absorption and photoluminescent spectra for two families of colloidal CdSe nanocrystals produced with the addition of trioctylphosphine (TOP), a known dispersant effective in dispersing Se. The ensembles were produced with molar ratios of 1 C14 acid to 1.5 Cd, 4 Cd to 1 Se and 1 Se to 5 TOP. The concentration of Se was $1\times10^{-3}$ mmol/g. The growth temperatures and periods were as indicated on the legend. Large quantities of TOP were found to inhibit the formation of colloidal CdSe nanocrystals of the families described above.

Doped CdSe nanocrystals: Trap emission, thermal stability, and quantum yield

Figure 17:
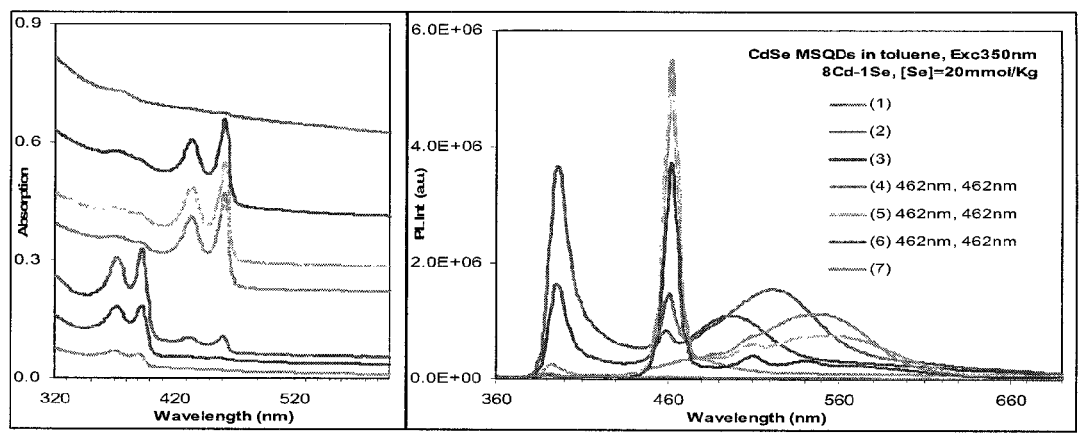
FIGS. 17, 18, 19 and 20 are absorption and emission are graphs showing optical characterizations of ensembles of CdSe without doping, and doped with of S, Zn and S and Zn.
Figure 18:
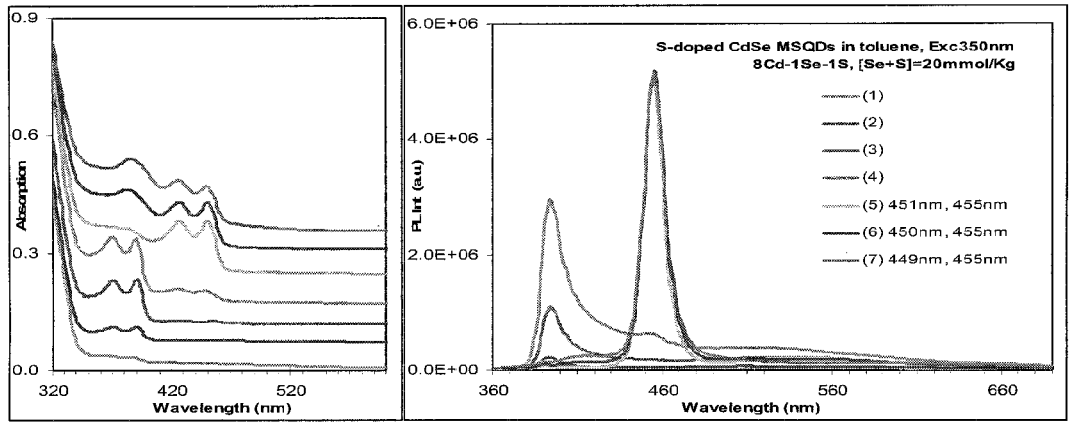
Figure 19:
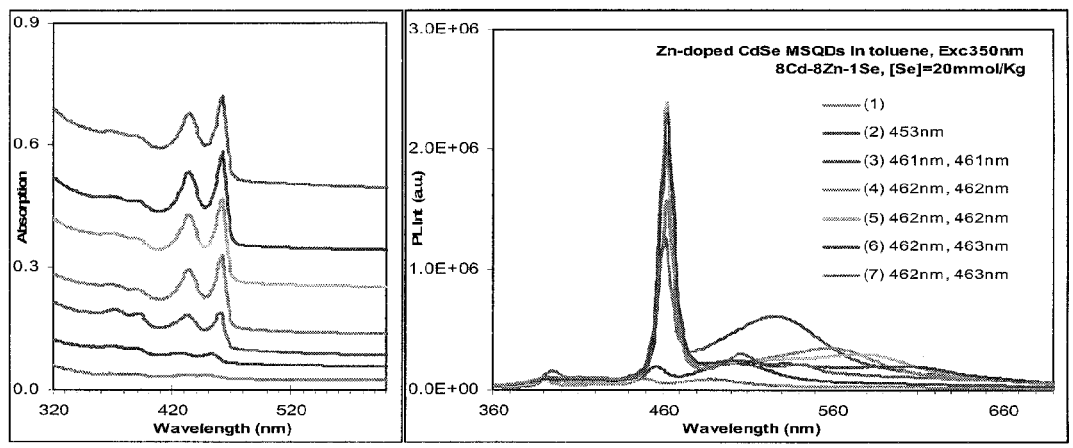
Figure 20:
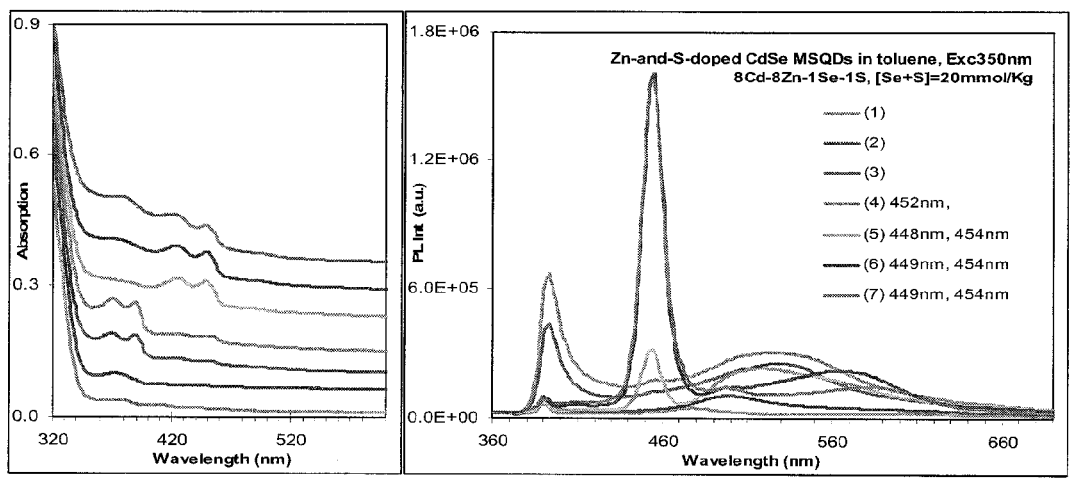

FIG. 17 plots 7 ensembles of CdSe nanocrystals without doping, and are presented for comparison with doped CdSe nanocrystals of FIGS. 18-20. Each ensemble was produced with the following molar ratios and concentrations: 8MA-8Cd-1Se, 1Se-3.5TOP, [Se]=20 mmol/Kg. These CdSe nanocrystals were found to exhibit trap emission (evinced by the broad emission peaks centered between 490 and 560 nm), thermal instability, and a quantum yield (QY) of ~7%.

These ensembles were produced by the following method:
1. Se+TOP were sonicated in a vial (0.5 dram) till all dissolved (55° C., ~60 min).
2. Cd(OAc)2.2H2O, myristic acid, and 4 g of ODE were placed in a 50 ml three-neck flask, and the mixture was heated up to 120° C. under vacuum (~50 mtorr) for ~120 min till everything was dissolved.
3. The flask was cooled to 70° C. (S+Se)/TOP was added in via a pipette, and rinsed with ~0.882 g of ODE. The mixture was degassed twice until no bubbling.
4. The resulting Cd/Se/S mixture was heated under N2, stepwise with a rate of ~7° C./min, and samples were taken at 10 min at 120, 140, 160, 180, 200, 220, and 240° C.

The ensembles of FIG. 17 are ordered as follows: (1) is the lowest amplitude absorption curve, and corresponds with the emission curve exhibiting a small peak near 395 nm, and a larger peak at around 475 nm; (2) is the $2^{nd}$ (lowest) amplitude curve, and corresponds with the emission curve having a peak of nearly 2.0 E+6 au near 395 nm, a smaller peak near 460 nm, and a broad peak intermediate the two near 495 nm; (3) is the $3^{rd}$ amplitude curve showing a highest absorption near 395 nm, and corresponds with the emission curve having a peak of nearly 4.0 E+6 au near 395 nm, along with a defined emission peak near 460; (4) is the $4^{th}$ amplitude curve showing a substantially no absorption near 395 nm, and corresponds with the emission curve having a second highest peak near 460 nm, along with a second highest broadened peak, centered near 550 nm; (5) is the $5^{th}$ amplitude curve having a highest emission peak near 460, and a broad peak that is furthest to the right; (6) is the 6$^{th}$ amplitude curve and exhibits a peak near 460 nm of almost 4.0 E+6 au, and a lowest trap emission of the samples that showed substantially any photoluminescence; and (7) is the 7$^{th}$ amplitude curve which exhibits neither very poorly defined absorption peaks, and substantially no photoluminescent emission.

In contrast, doping of the CdSe nanocrystals was investigated. Specifically batches of S doped CdSe nanocrystals were produced, with the following molar ratios and concentrations: 8MA-8Cd-1Se-1S, 1(S+Se)-3.5TOP+12 (S/I2=1); and [Se+S]=20 mmol/Kg, according to the following method:
1. Se+S+2,2'-dithiobisbenzothiazole (MBTS) (referred to herein as 12)+TOP were sonicated in a vial (0.5 dram) till all dissolved (55° C., ~60 min).
2. Cd(OAc)2.2H2O, myristic acid, and 4 g of ODE were placed in a 50 ml three-neck flask, and the mixture was heated up to 100° C. under vacuum (~50 mtorr) for ~150 min untill everything was dissolved. It was difficult to increase the temperature to 120° C.
3. The flask was cooled to 70° C., and (S+Se)/TOP was added in via a pipette, and rinsed with ~0.985 g of ODE; degassed twice till no bubbling.
4. The resulting Cd/Se/S mixture was heated under N2, stepwise with a rate of ~8° C./min, and sample ensembles were taken after 10 min at 120, 140, 160, 180, 200, 220, and 240° C., respectively.

FIG. 18 schematically illustrates absorption and photoluminescent intensity of resulting ensembles. As with the previous plots the ensembles (1)-(7) correspond with absorption curves in ascending order, and the emission curves for the 395 nm peaks increase with sample temperature until the 4$^{th}$ temperature (180° C.) is reached. The three subsequent curves show substantially equal intensity emission peaks, but are shifted by about one nm as stated in the legend.

It is noted that I2 can be zero, and that the more I2, the more the bandgap is blueshifted. I2 is used to promote S activity. It is noted that the QY was determined to be ~12%, and that when [Se+S]=80 mmol/Kg, QY was found to be as high as ~20%. This S doping induced a significant improvement to the QY. Not only were the peaks markedly better defined, the substantial absence of broad peaks (especially for ensembles 5-7), are direct indicators of the absence of trap state emission. Furthermore, the CdSe nanocrystals doped with S show thermal stability at 240° C.

Doping of CdSe nanocrystals with Zn was also investigated. Specifically batches of Zn doped CdSe nanocrystals were produced, with the following molar ratios and concentrations: 8MA-8Cd-8Zn-1Se, 1(Se)-2TOP, and [Se]=20 mmol/Kg, according to the following method:
1. Se+TOP is sonicated in a vial (0.5 dram) till all dissolved (55° C., ~60 min).
2. Cd(OAc)2.2H2O, myristic acid, Zn stearate and 4 g of ODE were placed in a 50 ml three-neck flask, and the mixture was heated up to 120° C. under vacuum (~50 mtorr) for ~120 min until everything was homogenized.
3. The flask was cooled to 70° C. under N2, and (Se)/TOP was added in via a pipette, and rinsed with ~0.872 g of ODE; degassed twice till no bubbling.
4. The resulting Cd/Zn/S mixture is heated under N2, stepwise with a rate of ~7° C./min, and sample ensembles were taken after 10 min at 120, 140, 160, 180, 200, 220, and 240° C.

FIG. 19 schematically illustrates absorption and photoluminescent intensity curves of resulting ensembles. As before, the ensembles (1)-(7) are in ascending order in the absorption plot. The order of the corresponding emission plots near the 460 peak, the order of the curves from lowest to highest intensity is: (1), (2), (3), (7), (4), (6), (5). The order of the amplitudes of the broad peaks indicative of trap state emission, from lowest amplitude to highest is: (1), (2), (7), (6), (5), (4), (3).

It was observed that thermal stability at, for example 240° C. was enhanced, and that trap emission was marginally suppressed, while the bandgap emission was changed little in comparison with the comparative undoped example.

Similar changes were observed when the CdSe nanocrystals were doped with both Zn and S (see FIG. 20), produced according to the following method:
1. Se+S+12+TOP were sonicated in a vial (0.5 dram) till all dissolved (55° C., ~60 min).
2. Cd(OAc)2.2H2O, myristic acid, zinc and 4 g of ODE were placed in a 50 ml three-neck flask, and the mixture was heated up to 100° C. under vacuum (~50 mtorr) for ~150 min untill everything was dissolved. It was difficult to increase the temperature until 120° C.
3. The flask was cooled to 70° C., and (S+Se)/TOP was added in via a pipette, and rinsed with ~0.985 g of ODE; degassed twice untill no bubbling.
4. The resulting Cd/Se/S mixture was heated under Ar, stepwise with a rate of ~8° C./min, and samples were taken after 10 min at 120, 140, 160, 180, 200, 220, and 240° C.

Example 2

Synthesis and Characterization of CdTe Colloidal Semiconductor Nanocrystals

The synthesis of CdTe ensembles is complicated by the fact that elemental Te will not dissolve uniformly in 1-octadecene (ODE). To compensate for this, the elemental Te is first dissolved in tricotylphosphine (TOP). The growth of the CdTe colloidal nanocrystal was carried out at 110° C. to 240° C.

Thus, Cd(OAc)$_2$.2H$_2$O (4 mmol) and CH$_3$(CH$_2$)$_n$COOH (n=6 or 12, 1 to 4 mmol) were mixed in ODE (~20 g), and were loaded in a 50-ml three-necked round bottom flask equipped with an air-cooled condenser. Afterwards, the reaction flask was heated up to 120° C. for about 2 to 3 hours under vacuum (50 mTorr) with stirring. Then, the reaction flask was cooled to 100° C. under N$_2$ gas.

Te (0.5 mmol) and trioctylphosphine (TOP, 1 mmol) were mixed separately with sonication for about 3 hours at 60° C. The resulting light yellow solution was added into the reaction flask and rinsed with about 5 g ODE. Accordingly, under a flow of purified nitrogen gas, the CdTe nanocrystals were grown at different temperatures with different growth periods.

Figure 21:
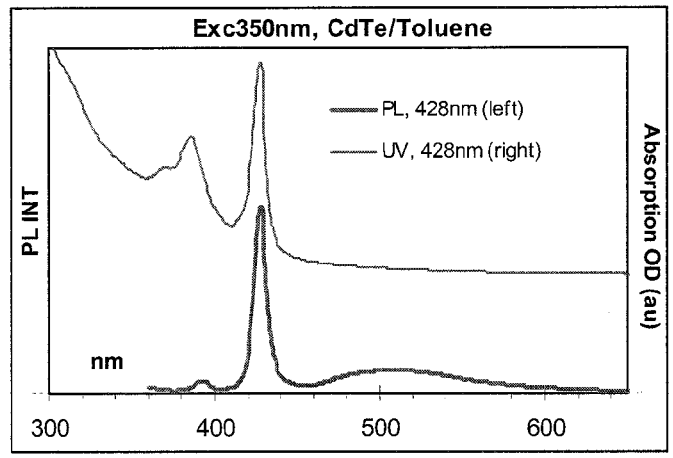
FIG. 21 is a graph showing absorption and photoluminescent emission spectra of a CdTe family 428.

FIG. 21 is a plot of the absorption (right y axis) and photoemission (excited at 350 nm, left y axis) spectra of a CdTe family 428 of colloidal semiconductor nanocrystals dispersed in toluene. The growth period was 90 min at 120° C. Family 428 CdTe was produced from a synthetic batch with a feed molar ratio of 1 myristic acid (C14) to 3 Cd, 8 Cd to 1 Te and 1 Te to 1.9 TOP. The concentration of Te was $2 \times 10^{-3}$ mmol/g.

It is noted that the produced ensembles of colloidal CdTe nanocrystals of the 428 family have an absorption peak near 428 nm and a bandgap photoluminescent peak near 429 nm, both of which having FWHM in the neighbourhood of 10 nm.

Figure 22:
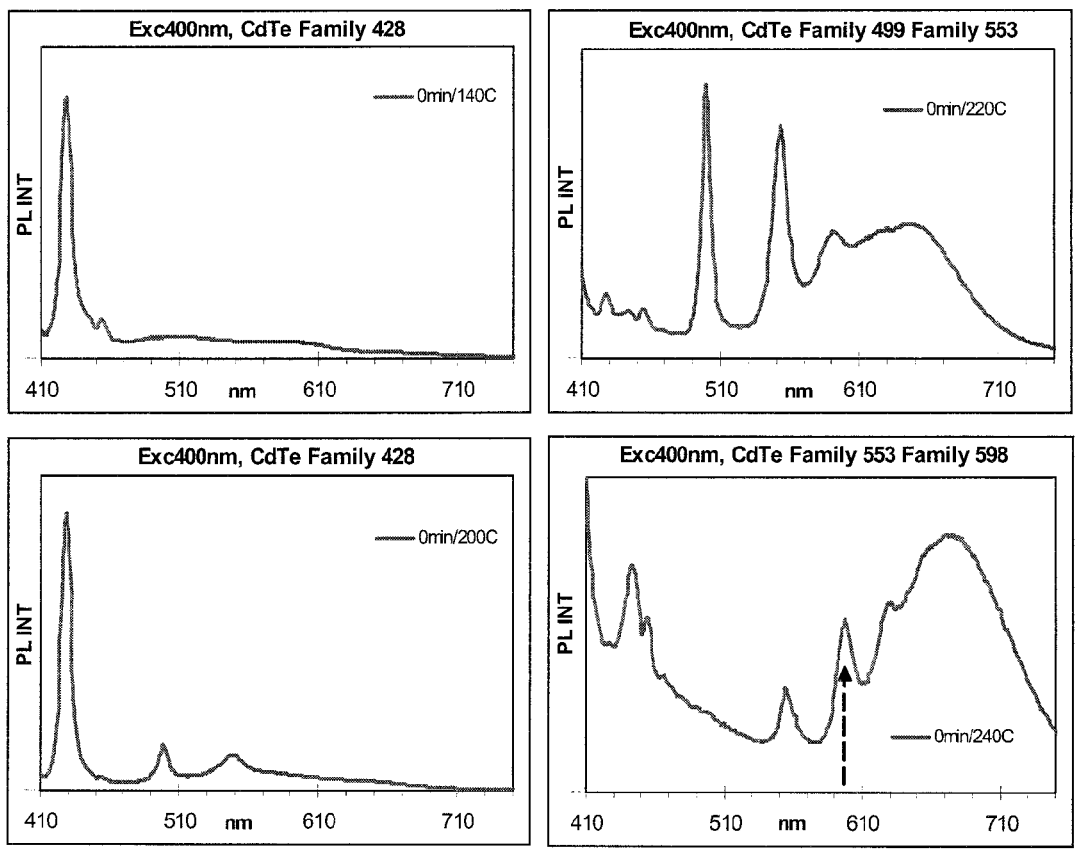
FIG. 22 are graphs photoluminescent emission spectra of 4 ensembles of quantum CdTe nanocrystals.

FIG. 22 illustrates four photoluminescent curves of respective ensembles of colloidal CdTe nanocrystals produced using molar ratios of 1 caprylic acid (C8) to 3 Cd, 4 Cd to 1 Te, and 1 Te to 1.9 TOP. The concentration of Te was $1 \times 10^{-3}$) mmol/g. There are four narrow linewidth bandgap photoemission peaks corresponding with absorption peaks near 428 nm, 499 nm, 553 nm and 598 nm. These are dubbed the 428, 499, 553, and 598 families, respectively. The growth temperature and periods are indicated in FIG. 22 for these CdTe colloidal semiconductor nanocrystal families. It is noted that the 428 family is substantially isolated in the top left panel and the bottom left panel shows low amplitude family production and an abundance of other quantum dots.

Example 3

Synthesis and Characterization of CdS Colloidal Semiconductor Nanocrystals

CdS colloidal semiconductor nanocrystals exhibiting single size optical properties with bandgap photoluminescent emission have been produced as well. The non-injection one-pot synthetic approach uses cadmium acetate dihydrate (Cd(OAc)$_2$.2H$_2$O) and bistrimethylsilyl sulfide ((TMS)$_2$S) as Cd and S sources, respectively. Stearic acid (C18) was used as the ligand forming compound and 1-octadecene (ODE) was used in the reaction medium. With low acid to Cd and high Cd to S molar ratios, the growth of the CdS nanocrystals was carried out at 90° C. to 240° C. to produce ensembles of these CdS colloidal semiconductor nanocrystals with a very high production of single size family. The synthetic method of Example 1 was adapted for this example.

Figure 23:
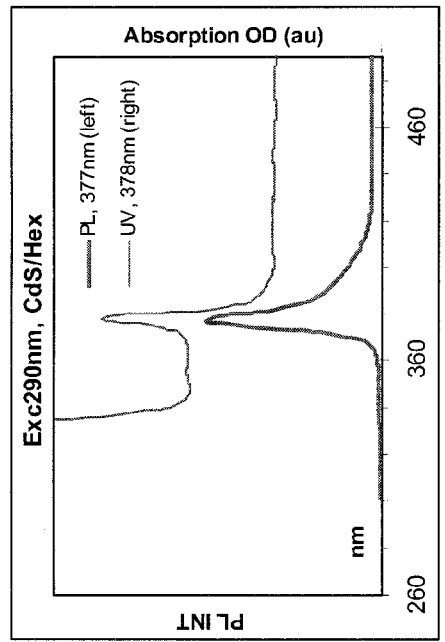
FIG. 23 is a graph showing absorption and photoluminescent emission spectra of a CdS family 378 produced with a S source of bistrimethylsilyl sulfide.

FIG. 23 shows an absorption (right y axis, thin line) and a photoluminescent emission (excited at 290 nm, left y axis, thick line) spectrum of an ensemble of colloidal CdS nanocrystals. A single family 378 is substantially exclusively produced and is dispersed in hexane. The growth period was 10 min at 120° C. The CdS Family 378 was produced with molar ratios of 1 stearic acid to 2 Cd and 4 Cd to 1 S. The molarity of S was 43×10$^{-3}$ mmol/g.

Other experiments with CdS were carried out under similar conditions. A family 324 was formed with octanoic acid instead of OA. The dimension is estimated to be about 1.64 nm. The S source was bistrimethylsilyl sulfide. Good production of this family is provided with 2 octanoic acid/4Cd/1S and [S] 33 mmol/L.

Figure 24:
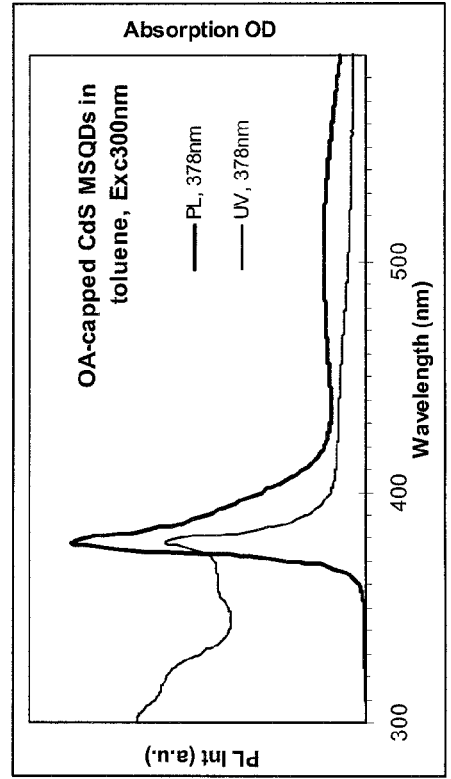
FIG. 24 is a graph showing absorption and photoluminescent emission spectra of a CdS family 378 produced with a S source of thioacetamide.
Figure 24A:
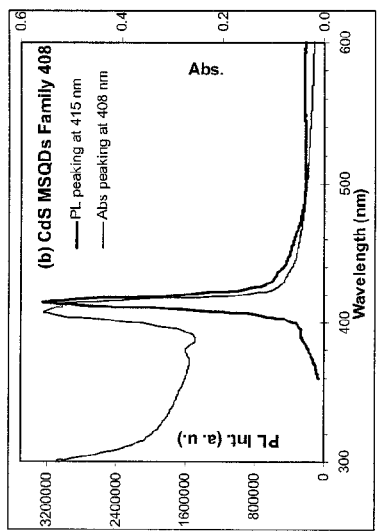
FIGS. 24A and B are graphs showing absorption and photoluminescent emission spectra of a CdS families 408 and 430 produced with elemental S source.
Figure 24B:
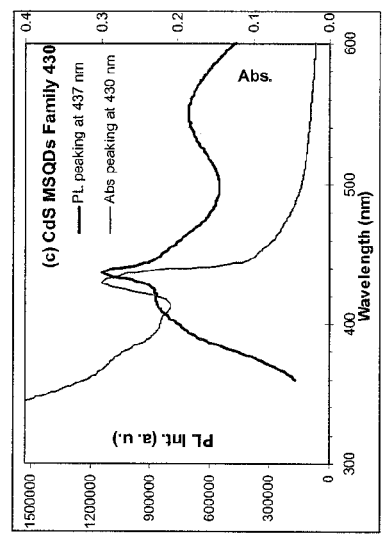

FIGS. 24A and 24B are graphs showing absorption and emission curves exhibited by the CdS families 408 and 430 using elemental S as the anion source. Good production of these families as shown were produced with ODE (reaction medium), 2MA-16Cd-1S, no 12, [S[=20 mmol-Kg, at 210° C. for 60 min and ODE (reaction medium), 2MA-8Cd-1S, no 12, [S[=20 mmol-Kg, at 240° C. for 20 min, respectively in FIGS. 24A and 24B. Various Cd:S ratios were experimented with, as was the inclusion of various amounts of TOP, as well as concentration of S. Various purities of the families were produced.

An alternative synthesis route for CdS nanocrystals uses thioacetamide (TAA) as a source compound of S. FIG. 24 graphs an absorption (thin line) and emission (thick line) spectra of CdS nanocrystals Family 378 dispersed in toluene. The excitation wavelength was 300 nm. The bandwidth is ~12 nm and quantum yield (QY with excitation wavelength of 350 nm) is ~17%. The total QY (bandgap photoluminescence and trap state emission) is ~60%. The nanocrystals were synthesized from a batch with the feed molar ratio of 2 oleic acid to 16 Cd to 1S. The thioacetamide (TAA) was used in a concentration of ~20 mmol/Kg in ODE. The growth was carried out at 110° C. for 90 minutes.

Figure 25:
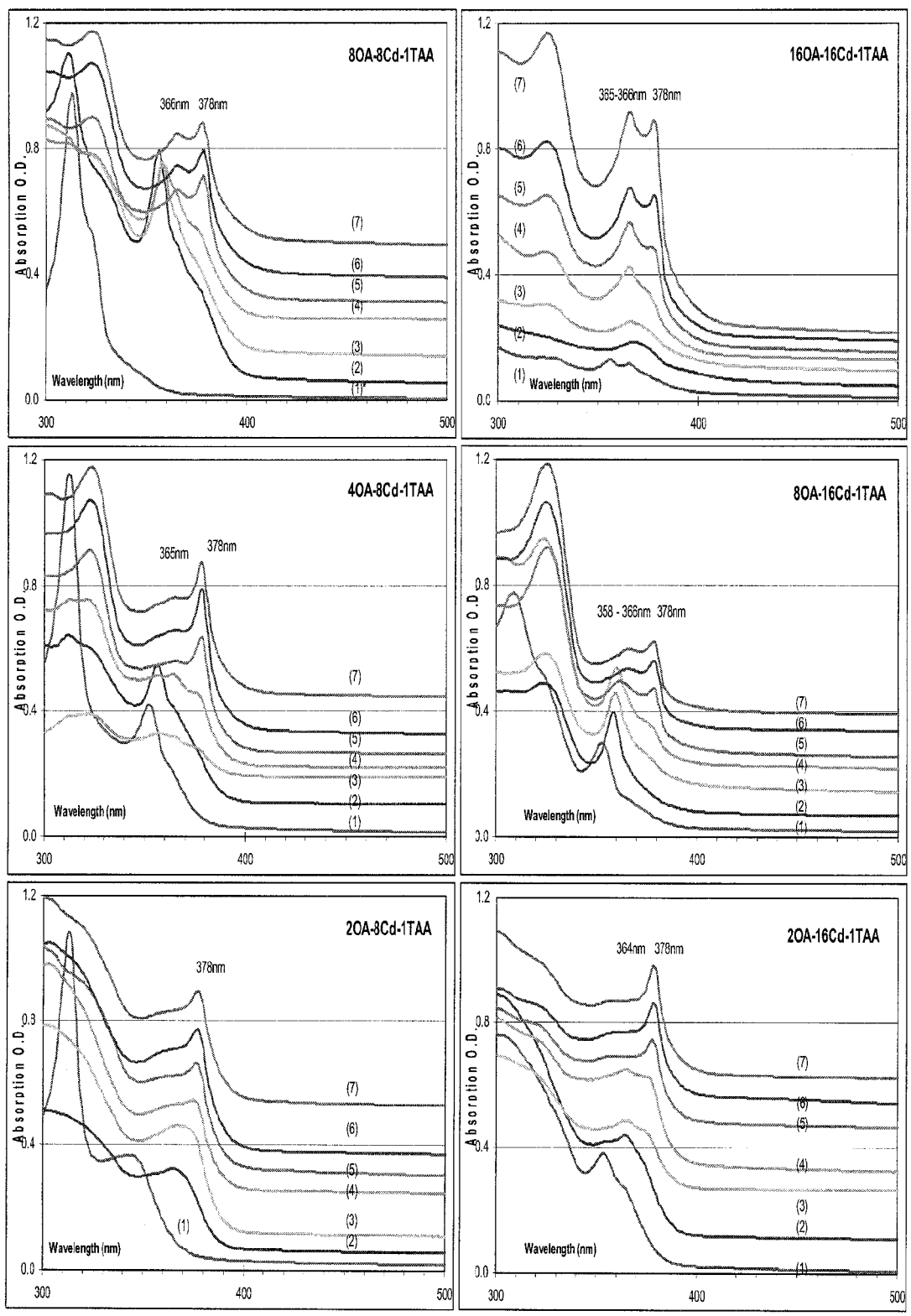
FIG. 25 is a series of graphs showing the effect that varying the feed molar ratios of OA/Cd and Cd/S on the absorption of the family 378 nanocrystals.

FIG. 25 graph the effect of varying the feed molar ratios of OA/Cd and Cd/S on the formation of the family 378 from six batches. These CdS nanocrystals were produced using TAA as the S source. The left varied OA/Cd but fixed 8Cd-to-1S feed molar ratios and the graphs on the right varied OA/Cd but fixed 16Cd-to-1S feed molar ratios. The growth was carried out at 110° C. and the growth periods were (1) 0 min, (2) 10 min, (3) 20 min, (4) 30 min, (5) 60 min, (6) 90 min, and (7) 120 min. The temporal evolution of the absorption (offset) of the CdS nanocrystals was monitored with 10 uL crude product dispersed in 1 mL toluene (except for curve 1*, which was normalized as 5 uL/1 mL).

Figure 26:
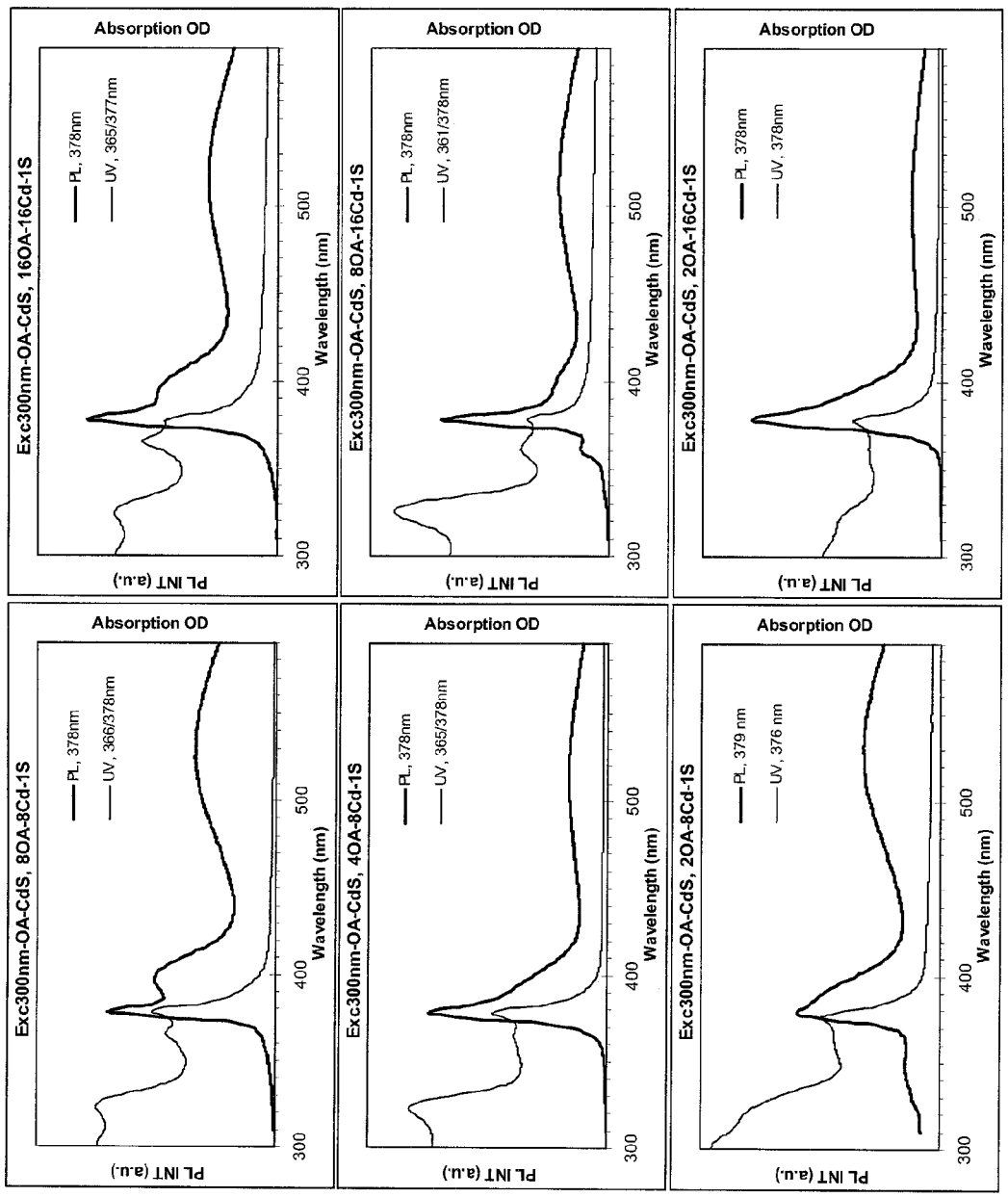
FIG. 26 is a series of graphs showing absorption and photoluminescent emission spectra with different molar ratios of acid, Cd and S.

FIG. 26 shows graphs of emission spectra (thick line) of 60-minute CdS nanocrystals from the six batches (shown in FIG. 25, ensemble (6)), together with their absorption spectra (thin line). The optical spectra of the 60-minute CdS nanocrystals were collected with 10 uL crude product dispersed in 1 mL toluene and the excitation wavelength of 300 nm.

Example 4

Synthesis and Characterization of Ternary CdTeS Colloidal Semiconductor Nanocrystals Single size dot optical properties have also been produced with bandgap photoluminescent colloidal CdTeSe nanocrystals. A non-injection one-pot synthetic approach was used in which cadmium acetate dihydrate (Cd(OAc)$_2$.2H$_2$O), elemental tellurium and elemental selenium were used as Cd, Te and Se sources, respectively. Caprylic acid (C8) was used as the ligand forming compound and 1-octadecene (ODE) was used in the reaction medium. With low acid to Cd and high Cd to (Te+Se) feed molar ratios, the growth of the colloidal CdTeSe nanocrystals was carried out at 120° C. to 240° C.

The synthetic method of Example 2 was adapted for this example. Typically, Cd(OAc)$_2$.2H$_2$O (0.32 mmol) and stearic acid (0.32 mmol) in ODE (~4.9 g) were loaded in a 50-mL three-necked round bottom flask equipped with an air-cooled condenser. The reaction flask was heated to 120° C. for 2 to 2.5 hours under constant stirring and vacuum (50 mTorr). The reaction flask was cooled to 60° C. afterwards.

Separately Se (0.04 mmol) and Te (0.04 mmol) and trioctylphosphine (TOP) (0.28 mmol) were mixed with sonication at 60° C. for about 2 hours. The resulting solution was added into the reaction flask and rinsed with about 0.1 g ODE. Furthermore, under a flow of purified nitrogen gas, the temperature was either raised directly to 120° C. or to 240° C. at a rate of 10° C./min or increased in a stepwise manner with holding at several intermediate temperatures for a period of time.

Figure 27:
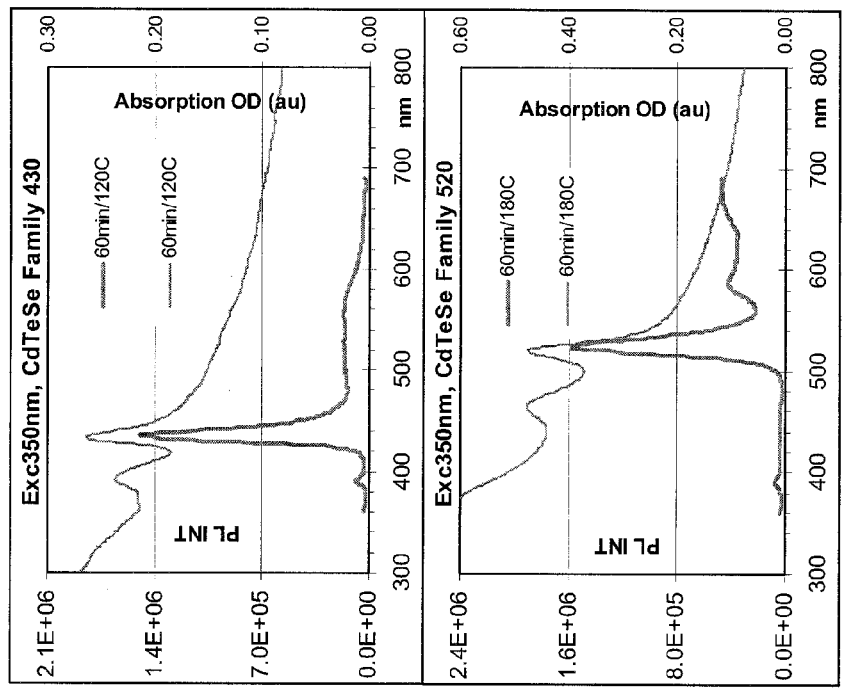
FIG. 27 includes graphs showing optical characterizations of ensembles featuring of 2 CdTeSe families.

FIG. 27 shows absorption and photoluminescent emission spectra of the produced ensembles showing the presence of ternary colloidal semiconductor nanocrystals. The ternary colloidal semiconductor nanocrystals were produced using feed molar ratios of 1 caprylic acid (C8) to 1 Cd, 8 Cd to 1 Te and 1 Se, and 1 (Te+Se) to 7 TOP. Two CdTeSe families were obtained, with their bandgap photoemission peaking near 430 and 520 nm. The growth temperature and periods for these CdTeSe families were as indicated in FIG. 27. It is noted that the absorption and emission peaks had FWHM of slightly greater than 10 nm.

Example 5

Group 12-Group 15 Semiconductor Nanocrystals

The synthesis method was successfully applied to produce CdP nanocrystals via a non-injection-based approach. The CdP nanocrystals were synthesized in a pure form and exhibited bright bandgap photoemission peaking at 455 nm with full width at half maximum (FWHM) of only 17 nm and sharp bandgap absorption peaking at 451 nm. Cadmium acetate dihydrate ($Cd(OAc)_2.2H_2O$) and tris(trimethylsilyl)phosphine ($(TMS)_3P$) were used as Cd and P source compounds, respectively; the synthesis was carried out in 1-octadecene (ODE), a non-coordinating solvent. Cadmium acetate and oleic acid (OA) were loaded in a reaction flask with ODE and reacted at ~120° C. to form a Cd precursor Cd(OAc)(OA); the Cd precursor cadmium acetate oleate (Cd(OAc)(OA)) formed in ODE with the molar feed ratio of oleic acid (OA) to $Cd(OAc)_2.2H_2O$ smaller than 2. Afterwards, the temperature was decreased to ~60° C. and (($TMS)_3P$) was added. The thermodynamically driven formation of the single-sized nanocrystals was realized at low reaction temperature ranging from 80° C. to 140° C. The formation kinetics, as monitored by the temporal evolution of the optical properties, suggested the presence of single or magic-sized nanocrystals (MSNs) rather than regular quantum dots.

Bulk cadmium phosphide CdP, a typical type II-V semiconductor with a bandgap of 0.55 eV, has been explored for various applications including photodetectors, lasers, and photovoltaics. Meanwhile, with an excitonic radius of 18 nm, bandgap-engineered CdP nanocrystals should have potential in many areas such as optoelectronics.

In a typical synthesis, 0.2 mmol $Cd(OAc)_2.2H_2O$, 0.2 mmol oleic acid (OA), and 4 grams ODE were loaded in a 3-neck reaction flask at room temperature. A Cd precursor, Cd(OAc)(OA), was freshly synthesized at 120° C. under vacuum for two hours. Subsequently, this Cd precursor solution was cooled down to ~40° C. under Argon. Meanwhile, 0.05 mmol $(TMS)_3P$ was mixed with 1 gram ODE and purged by ultra-purified nitrogen ($N_2$). The $(TMS)_3P$ source solution was added into the freshly-prepared Cd(OAc)(OA) solution with stirring, followed by degassing and heating under $N_2$ at a rate of ~10° C. every 5 minutes to 240° C. Aliquots were taken at each increase of 20° C. of the reaction temperature.

The formation kinetics of the nanocrystals was monitored by the temporal evolution of their optical properties. Note that the present approach is non-injection-based, with the use of Cd(OAc)(OA) instead of $Cd(OA)_2$ as the Cd precursor and with the slow increase of the reaction temperature from 40° C. Such an approach ensured the existence of a limited amount of $Cd^{2+}$, released from the Cd precursor.

Figure 28:
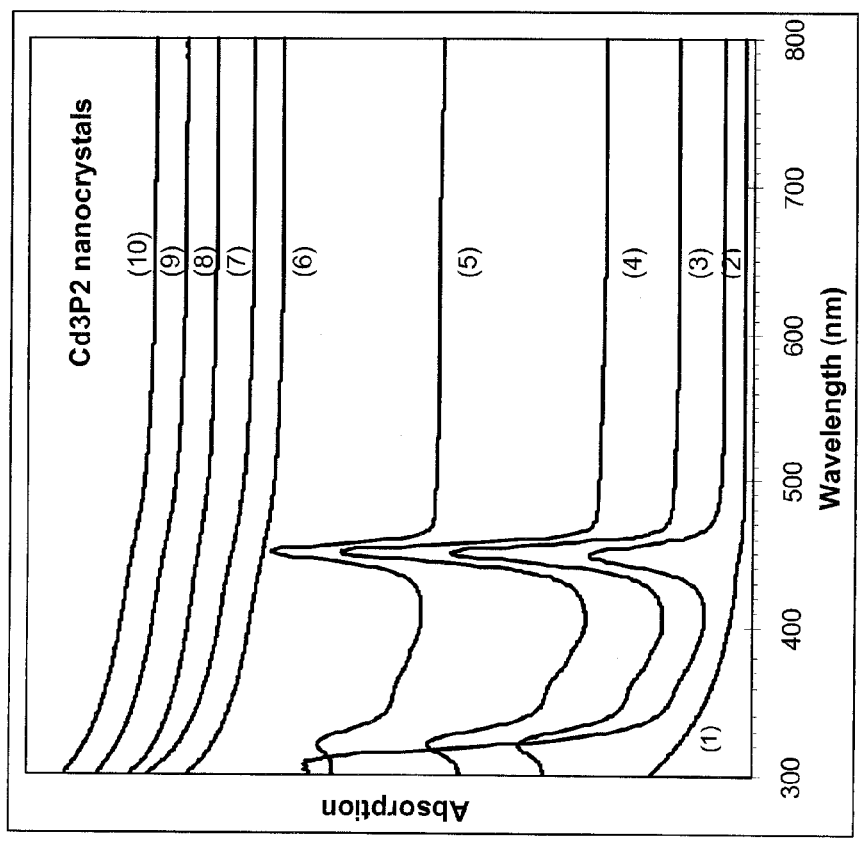
FIG. 28 is a graph showing absorption spectra indicating themal growth of CdP nanocrystals having a family near 451 nm.

FIG. 28 shows the temporal evolution of the optical properties of the as-prepared CdP nanocrystals sampled from one synthetic batch with the feed molar ratio of 4OA-4Cd-1P and the concentration of $(TMS)_3P$ of 10 mmol/kg in 5 grams of ODE. The nanocrystals were subjected to a non-stop heating regime at a heating rate of 10° C. per 5 minutes, throughout which the reaction medium was heated from 60° C. to 240° C. For the ten nanocrystal ensembles sampled at 60° C. (1), 80° C. (2), 100° C. (3), 120° C. (4), 140° C. (5), 160° C. (6), 180° C. (7), 200° C. (8), 220° C. (9), and 240° C. (10), and disperse in toluene. The sample concentration was 10 μL/mL.

When the reaction temperature was between 80° C. to 140° C. (2)-(5), the formation of single family of CdP nanocrystals was clearly preferred. This family $(Cd_3P_2)_n$ in a pure form, exhibited a sharp and persistent bandgap absorption peaking at ~451 nm. The persistence of the bandgap absorption peaking at ~451 nm during the reaction between 80° C. to 140° C. suggested the absence of growth in size of the nanocrystals once they were developed. There was little growth in size at higher reaction temperatures and/or with longer reaction periods. During the increase of the reaction temperature from 80° C. to 120° C., the yield of the CdP MSNs in pure form was enhanced significantly. During the increase of the reaction temperature from 120° C. to 140° C., the MSN yield decreased; thus, the CdP MSNs became thermally unstable at ~120° C. When the reaction temperature reached 160° C. and higher (6)-(10), the CdP MSNs disappeared almost completely. It is postulated that, at these temperatures, the nanocrystals might have dissolved back into soluble species (such as monomers).

After 160° C., the presence of regular nanocrystals (having inhomogeneous broadened spectra) was clear, and they exhibited redshifts of their onset band-edge absorption. At such high reaction temperature, the formation of the regular (non magic size or same size) nanocrystals was kinetically dominant due to the fast reaction. Once the soluble regular quantum dot nuclei are saturated from solution they will form solid-state nanocrystals; the growth in size of which seemed to be evident from (6) to (10).

It is noteworthy that the oleate group of Cd(OAc)(OA) provides the cadmium precursor with the right solubility to dissociate at low temperature such as 40° C. The resulting $Cd^{2+}$ with a limited concentration in the solution led to the formation of the narrow linewidth nanocrystals (with activation at ~80° C. and thermal stability below ~120° C.). Under the same reaction conditions, when oleic acid was replaced by myristic acid (MA), the Cd precursor was Cd(OAc)(MA). However, Cd(OAc)(MA) was not soluble at temperature below 110° C., and thus few MSNs were formed.

Figure 29:
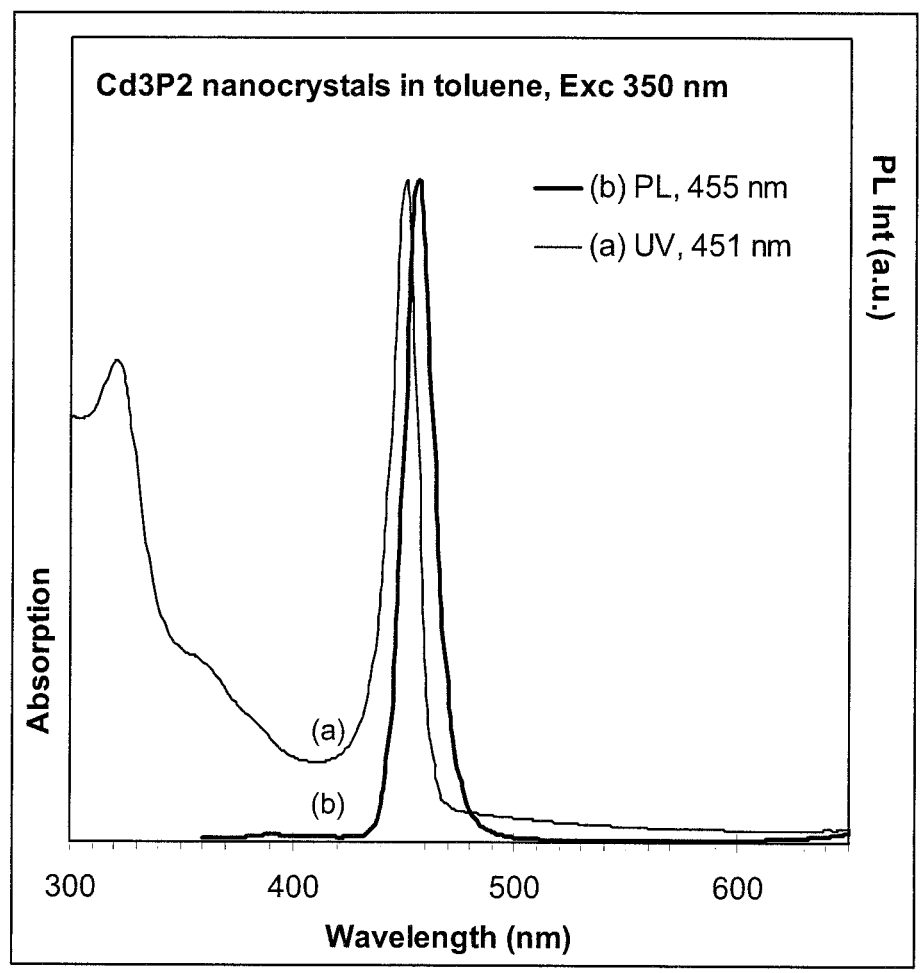
FIG. 29 is a graph showing absorption and photoluminescent emission spectra of the 451 CdP family.

The CdP nanocrystals exhibited bandgap emission, as shown in FIG. 29. FIG. 29 shows emission (thick line) and UV-Visible absorption (thin line) spectra of the as-synthesized CdP nanocrystals, sampled at 140° C. The FWHM is ~17 nm and QY is ~3% (Exc 400 nm).

Storage stability experiments were performed. The photoluminescent (PL) quantum yield (QY) of the bandgap emission of the fresh sample was estimated to be ~3%, and interestingly, aged sample (4.5 months old) gave a QY of 7%. The highest QY of the regular (not single size) CdP semiconductor nanocrystals was reportedly 15%, but that was from both bandgap emission, and a broad and intense trap state emission. The present CdP nanocrystals exhibited only bandgap emission with little trap emission. The emission peak position of the nanocrystals, similar to their absorption, was independent of the reaction periods and temperature.

The CdP nanocrystal ensembles exhibited bandgap absorption peaking at 451 nm and bandgap emission peaking at 455 nm with FWHM of only 17 nm. The narrow linewidth is an indicator that an ensemble consisting of nanocrystals of a single size were produced. This ensemble is termed as CdP MSN Family 451. The small FWHM value of the bandgap emission of the present MSN ensemble has never been achieved before and is drastically smaller than those reported of 50 nm-150 nm with equally scalable, known processes.

Typical energy dispersive X-ray emission (EDX) study suggested the elemental composition of the single-sized nanocrystals to be CdP.

REFERENCES

The contents of the entirety of each of which are incorporated by this reference.

Bawendi, Moungi G; et al. *Adv. Mater.* 1999, 11, 1243.
Bowers, M J; et al. *J. Am. Chem. Soc.* 2005, 127, 15378-15379.
Cao, Y C. *Angewandte Chimie Int. Ed.* 2005, 44, 6712-6715.
Cao, Y C. International Publication WO 2006/023206 published Mar. 2, 2006.
Dagtepe, P; Chikan, V; Jasinski, J; Leppert, V J. *J Phys. Chem. C*, 2007, 111, 14977-14983.
Dai, Q; et al. *Nanotechnology* 2007, 18, 405603.

Fernando, M.; Yu, G W; Papadimitrakopoulos, R; Li, F; Shi, N; Ramprasad, R. *J. Computer-Aided Mater Des.* 2007, 14, 167.

Kasuya, A; et al. *Nat. Mater.* 2004, 3, 99-102.

Kudera, S; et al. *Adv. Mater.* 2007, 19, 548-552.

Peng, X; Qu, L. International Publication WO 03/012006 published Feb. 13, 2003.

Ptatschek, V; et al. *Ber. Bunsenges. Phys. Chem.* 1998, 102, 85-95.

Schlegel, G; Bohnenberger, J; Potapova, I; Mews, A. *Phys. Rev. Lett.* 2002, 88(13), 137401.

Soloviev, V N; et al. *J. Am. Chem. Soc.* 2001, 123, 2354-2364.

Wuister, S F; Van Driel, F; Meijerink, A. *Phys. Chem. Chem. Phys.*, 2003, 5, 1253-1258.

Yu, W W; Peng, X. *Angewandte Chimie Int. Ed.* 2002, 41, 13, 2368-2371

Yu, W W; Qu, L; Guo, W; Peng, X. *Chem. Mater.* 2003, 15, 2854-2860.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. An ensemble of bandgap photoluminescent colloidal semiconductor nanocrystals having at least one absorption and bandgap photoemission linewidth of 10±3 nm, wherein the semiconductor is CdSe, and the bandgap photoluminescence absorption peak is near one of: 465 nm, 513 nm, and 551 nm, or the bandgap photoluminescence absorption peak is near 395 nm, with a photoemission peak redshifted 0-2 nm with respect to the absorption peak.

2. An ensemble of bandgap photoluminescent colloidal semiconductor nanocrystals having at least one absorption and bandgap photoemission linewidth of 10±3 nm, wherein: the semiconductor is CdS, and the bandgap photoluminescence absorption peak is near one of: 311 nm, 324 nm, 353 nm, 365 nm, 378 nm, 408 nm and 430 nm; or the semiconductor is CdTe, and the bandgap photoluminescence absorption peak is near 428 nm, or both the bandgap photoluminescence absorption peak and its corresponding photoemission peaks are near one of: 499 nm, 553 nm and 598 nm.

3. An ensemble of bandgap photoluminescent colloidal semiconductor nanocrystals having at least one absorption and bandgap photoemission linewidth of 10±3 nm, wherein the semiconductor is CdTeSe, and the bandgap photoluminescence absorption peak is near one of: 430 nm and 520 nm.

4. An ensemble of bandgap photoluminescent colloidal semiconductor nanocrystals having at least one absorption and bandgap photoemission linewidth of 10±3 nm, wherein the semiconductor is CdSe doped with Zn or S, and the bandgap photoluminescence absorption peaks are blue-shifted with respect to the undoped CdSe bandgap photoluminescence absorption peak which is near one of: 465 nm, 513 nm, and 551 nm, or the bandgap photoluminescence absorption peak is near 395 nm, with a photoemission peak redshifted 0-2 nm with respect to the absorption peak.

5. An ensemble of bandgap photoluminescent colloidal $Cd_3P_2$ nanocrystals having a bandgap photoluminescence absorption peak near 455 nm with a photoemission linewidth of about 17 nm.

6. The ensemble of claim 1 wherein the ensemble exhibits exactly one absorption and bandgap photoemission linewidth.

7. The ensemble of claim 1 wherein the colloidal semiconductor nanocrystals are passivated by a surface-capping group.

8. The ensemble of claim 7, wherein the surface-capping group comprises one of: a ligand forming compound containing a carboxylic acid moiety; and short chain and long chain ligand forming compounds.

9. The ensemble of claim 2 wherein the ensemble exhibits exactly one absorption and bandgap photoemission linewidth.

10. The ensemble of claim 9 wherein the colloidal semiconductor nanocrystals are passivated by a surface-capping group.

11. The ensemble of claim 10, wherein the surface-capping group comprises one of: a ligand forming compound containing a carboxylic acid moiety; and short chain and long chain ligand forming compounds.

12. The ensemble of claim 3 wherein the ensemble exhibits exactly one absorption and bandgap photoemission linewidth.

13. The ensemble of claim 12 wherein the colloidal semiconductor nanocrystals are passivated by a surface-capping group.

14. The ensemble of claim 13, wherein the surface-capping group comprises one of: a ligand forming compound containing a carboxylic acid moiety; and short chain and long chain ligand forming compounds.

15. The ensemble of claim 4 wherein the ensemble exhibits exactly one absorption and bandgap photoemission linewidth.

16. The ensemble of claim 15 wherein the colloidal semiconductor nanocrystals are passivated by a surface-capping group.

17. The ensemble of claim 16 wherein the surface-capping group comprises one of: a ligand forming compound containing a carboxylic acid moiety; and short chain and long chain ligand forming compounds.

18. The ensemble of claim 5 wherein the ensemble exhibits exactly one absorption and bandgap photoemission linewidth.

19. The ensemble of claim 18 wherein the colloidal semiconductor nanocrystals are passivated by a surface-capping group.

20. The ensemble of claim 19 wherein the surface-capping group comprises one of: a ligand forming compound containing a carboxylic acid moiety; and short chain and long chain ligand forming compounds.

21. The ensemble of claim 1, wherein the photoemission peak redshifted 0-2 nm with respect to the absorption peak.

22. The ensemble of claim 2, wherein the CdS photoemission peak is redshifted 0-5 nm with respect to the absorption peak, or the CdTe photoemission peak is near 429 nm, and is within about 1 nm of the absorption peak.

23. The ensemble of claim 3, wherein the photoemission peak substantially overlies the absorption peak.

24. The ensemble of claim 5, wherein the photoemission peak is near 451 nm.

* * * * *

UNITED STATES PATENT AND TRADEMARK OFFICE
CERTIFICATE OF CORRECTION

PATENT NO. : 8,932,489 B2
APPLICATION NO. : 13/058239
DATED : January 13, 2015
INVENTOR(S) : Kui Yu and Jianying Ouyang Page 1 of 1

It is certified that error appears in the above-identified patent and that said Letters Patent is hereby corrected as shown below:

IN THE SPECIFICATION

Column 19; Line 11 should read
trations: 8MA-8Cd-1Se-1S, 1(S+Se)-3.5TOP+I2 (S/I2=1);

Column 20; Line 13 should read
1.SE+S+I2+TOP were sonicated in a vial (0.5 dram) till all Signed and Sealed this
Fifth Day of May, 2015

Michelle K. Lee
*Director of the United States Patent and Trademark Office*